United States Patent
Tajitsu et al.

(10) Patent No.: US 11,700,772 B2
(45) Date of Patent: *Jul. 11, 2023

(54) PIEZOELECTRIC STRUCTURE AND DEVICE USING SAME

(71) Applicants: TEIJIN FRONTIER CO., LTD., Osaka (JP); KANSAI UNIVERSITY, Suita (JP)

(72) Inventors: Yoshiro Tajitsu, Suita (JP); Yuhei Ono, Osaka (JP); Shunsuke Kanematsu, Osaka (JP); Tomoyoshi Yamamoto, Osaka (JP)

(73) Assignees: TEIJIN FRONTIER CO., LTD., Osaka (JP); KANSAI UNIVERSITY, Osaka (JP)

( * ) Notice: Subject to any disclaimer, the term of this patent is extended or adjusted under 35 U.S.C. 154(b) by 980 days.

This patent is subject to a terminal disclaimer.

(21) Appl. No.: 16/476,648

(22) PCT Filed: Jan. 10, 2018

(86) PCT No.: PCT/JP2018/000362
§ 371 (c)(1),
(2) Date: Jul. 9, 2019

(87) PCT Pub. No.: WO2018/131612
PCT Pub. Date: Jul. 19, 2018

(65) Prior Publication Data
US 2021/0135087 A1    May 6, 2021

(30) Foreign Application Priority Data
Jan. 11, 2017 (JP) ............................... 2017-002918

(51) Int. Cl.
*G01L 1/16* (2006.01)
*H10N 30/00* (2023.01)
(Continued)

(52) U.S. Cl.
CPC .......... *H10N 30/1061* (2023.02); *D04C 1/02* (2013.01); *D04C 1/06* (2013.01); *G01L 1/16* (2013.01);
(Continued)

(58) Field of Classification Search
CPC . H01L 41/082; H01L 41/042; H01L 41/1132; H01L 41/193; D04C 1/02;
(Continued)

(56) References Cited

U.S. PATENT DOCUMENTS 6,692,456 B1 * 2/2004 Eppstein ................ A61N 1/327
607/2
2001/0041598 A1    11/2001 Yoshino et al.
(Continued)

FOREIGN PATENT DOCUMENTS

CN    101246067 A    8/2008
CN    101437663 A    5/2009
(Continued)

OTHER PUBLICATIONS

Kansai University et al., 伝統工芸の技術をウェラブルセンサーへ圧電組紐の開発と展開について [online], Jan. 12, 2017, [search date Feb. 26, 2018], internet: URL:https://www.teijin.co.jp/news/2017/jbd70112.pdf, non-official translation (Regarding development and spread of piezoelectric braid using traditional crafts as wearable sensor).
(Continued)

*Primary Examiner* — Max H Noori
(74) *Attorney, Agent, or Firm* — Sughrue Mion, PLLC

(57) ABSTRACT

Provided is a piezoelectric structure including a braid composed of a conductive fiber and piezoelectric fibers, the braid being a covered fiber having the conductive fiber as the core and the piezoelectric fibers covering the periphery of the conductive fiber, wherein the covered fiber has at least one
(Continued)

bent section, and when the piezoelectric structure is placed on a horizontal surface, the height from the horizontal surface to the uppermost section of the piezoelectric structure is greater than the diameter of the covered fiber.

23 Claims, 16 Drawing Sheets

(51) Int. Cl.
  *D04C 1/02* (2006.01)
  *D04C 1/06* (2006.01)
  *H10N 30/30* (2023.01)
  *H10N 30/80* (2023.01)
  *H10N 30/857* (2023.01)
(52) U.S. Cl.
  CPC ......... *H10N 30/302* (2023.02); *H10N 30/802* (2023.02); *H10N 30/857* (2023.02); *D10B 2401/16* (2013.01); *D10B 2401/18* (2013.01)
(58) Field of Classification Search
  CPC ......... D04C 1/06; G01L 1/16; D10B 2401/16; D10B 2401/18
  See application file for complete search history.

(56) References Cited

U.S. PATENT DOCUMENTS

| | | | |
|---|---|---|---|
| 2005/0211948 A1* | 9/2005 | Tsujiura | H01L 41/187 252/62.9 PZ |
| 2008/0197988 A1 | 8/2008 | Nathan | |
| 2009/0085444 A1 | 4/2009 | Alvarez Icaza Rivera et al. | |
| 2013/0057499 A1 | 3/2013 | Ando et al. | |
| 2015/0280102 A1* | 10/2015 | Tajitsu | H10N 30/60 310/338 |
| 2017/0029985 A1* | 2/2017 | Tajitsu | H01L 41/113 |
| 2017/0331027 A1* | 11/2017 | Kim | H01L 41/33 |
| 2018/0108826 A1* | 4/2018 | Tajitsu | H01L 41/047 |
| 2018/0358541 A1* | 12/2018 | Tajitsu | H01L 41/113 |
| 2019/0214542 A1* | 7/2019 | Yoshida | G01L 1/16 |
| 2019/0273199 A1* | 9/2019 | Tajitsu | D04B 1/16 |

FOREIGN PATENT DOCUMENTS

| | | |
|---|---|---|
| EP | 3 471 159 A1 | 4/2019 |
| JP | 2001-189792 A | 7/2001 |
| JP | 3540208 B2 | 4/2004 |
| JP | 2007-124276 A | 5/2007 |
| JP | 2011-253517 A | 12/2011 |
| JP | 2016-127202 A | 7/2016 |
| JP | 2017-146283 A | 8/2017 |
| WO | 2007/015710 A2 | 2/2007 |
| WO | 2014/058077 A1 | 4/2014 |
| WO | 2016/175321 A1 | 11/2016 |
| WO | 2016/188853 A1 | 12/2016 |
| WO | 2017/213108 A1 | 12/2017 |

OTHER PUBLICATIONS

International Search Report of PCT/JP2018/000362 dated Mar. 13, 2018 [PCT/ISA/210].

* cited by examiner (a)  (b)

(c)
(i) Linear section elongated
(ii) Elongation of linear section released
(iii) Loop section plucked

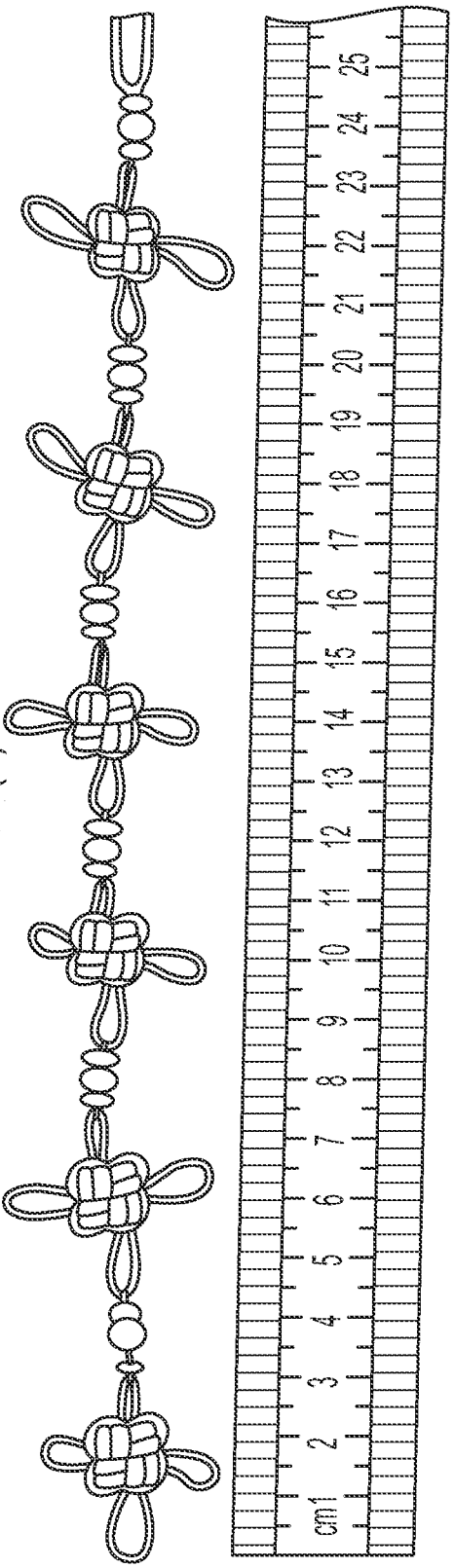
FIG. 10(a)
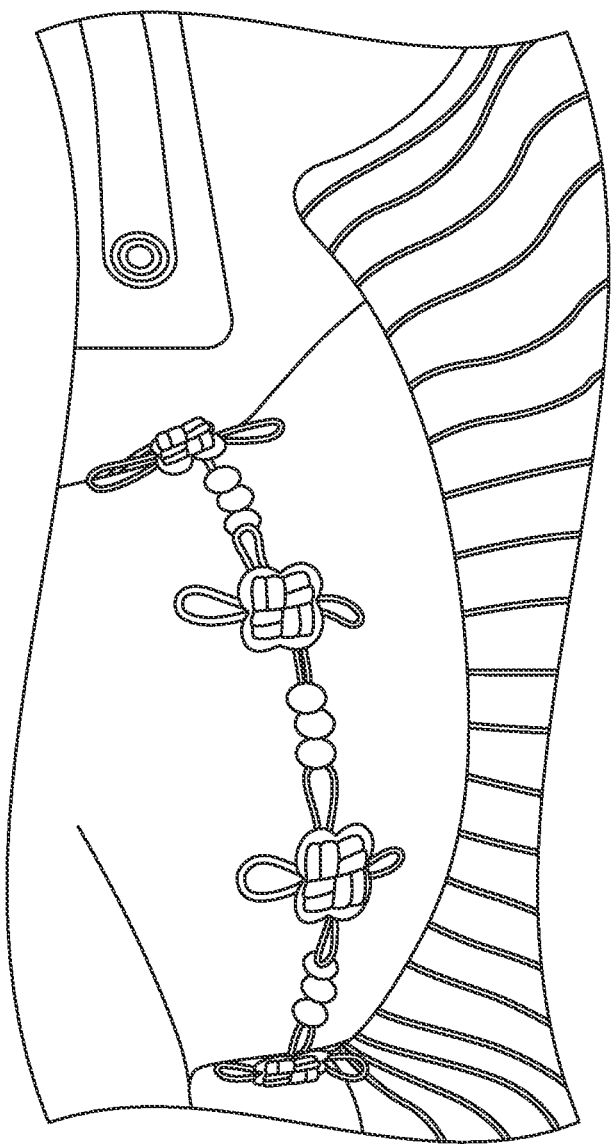

PIEZOELECTRIC STRUCTURE AND DEVICE USING SAME

CROSS REFERENCE TO RELATED APPLICATIONS

This application is a National Stage of International Application No. PCT/JP2018/000362, filed Jan. 10, 2018, claiming priority to Japanese Patent Application No. 2017-002918, filed Jan. 11, 2017.

FIELD

The present invention relates to a piezoelectric structure using piezoelectric fibers and to a device using it.

BACKGROUND

Recent years have seen a drastic increase in input devices employing touch panel systems, i.e., "touch input devices". With the development of thin display technology for bank ATMs and station ticket-vending machines, as well as cellular phones, portable gaming devices, portable music players and the like, there has been a massive increase in devices employing touch panel systems as the input interface.

Recently, for cellular phones and smartphones, many systems are used with touch input devices installed on display devices that employ liquid crystals or organic electroluminescence, allowing direct input on the screen. To further increase the convenience of portable devices such as smartphones, which are undergoing constant advancements, it is preferred to have multiple touch input means instead of only a screen input device alone.

For example, when it is attempted to execute input with the finger on the display screen of a smartphone, the smartphone is held with one hand while input is executed with fingers of the other hand, thus requiring manipulation using both hands. However, if a touch sensor or the like is incorporated into the smartphone case, then the advantage of being operable with one hand is provided.

One example of this is disclosed in PTL 1, as a system whereby a touch sensor or the like is incorporated into a section of the case at a non-display-screen portion, such as the back of the display screen that is not normally used as a sensor, and screen data items or anchor points are selected by the sensor. Input devices that implement touch sensors such as in PTL 1 include electrostatic capacitive systems, resistance film-type systems, optical systems, electromagnetic induction systems and systems using piezoelectric sheets.

An example of a system using a piezoelectric sheet is disclosed in PTL 2. A piezoelectric sheet system differs from the touch sensors of electrostatic capacitive systems or resistance film systems, in that the single element can simultaneously detect both pressure applied to the sensor and positional information, thus allowing diverse types of input information to be provided. PTL 2 also discloses an example of using the piezoelectric polymer polylactic acid, as a specific example of a piezoelectric sheet member.

A piezoelectric sheet comprising polylactic acid, as disclosed in PTL 2, is an excellent element that can be flexibilized and that can simultaneously detect positional information and stress with the single element, but in order to obtain sufficient electrical output it is necessary to relax the piezoelectric sheet to some extent by the stress during input. A piezoelectric sheet comprising polylactic acid generates electrical output by shearing stress applied to the sheet, but sufficient electrical output cannot be obtained by tension or compression. In order to obtain large electrical output, therefore, it is necessary to relax the sheet by pressing force from the direction perpendicular to the plane of the piezoelectric sheet. For example, considering that the piezoelectric sheet is laminated on or integrated with the case on the back side of a smartphone, it is spatially difficult to relax the sheet by pressing force applied to the sheet in the direction perpendicular to the sheet, and the goal has been to generate sufficient electrical output simply by rubbing the surface of the piezoelectric element. In addition, since the case surface of a smartphone or the like is not always a flat plane and may include numerous three-dimensional irregularities in its shape for reasons of design maintenance, it has been desirable for the piezoelectric elements used in it to be flexible.

Also, PTL 3 discloses piezoelectric fiber technology in which a piezoelectric polymer is oriented by adding twists. The piezoelectric fibers described in PTL 3 yield electrical output through tension or compression of the fibers, by having the fibers pre-twisted via special production methods. However, PTL 3 discloses absolutely no technology for generating and extracting sufficient electrical output in response to shearing stress by rubbing of fiber surfaces. Thus, it is extremely difficult to incorporate such a piezoelectric fiber element into a smartphone case or the like, and extract sufficient electrical output by relatively small amounts of applied stress such as rubbing the surface with a finger or the like.

It is generally known that polylactic acid fibers oriented by uniaxial stretching produce virtually no polarization in response to stretching or compression stress in the direction of the stretching axis or the direction perpendicular to it, and therefore yield essentially no electrical output by the relatively small applied stress generated by rubbing the fiber surfaces with a finger. On the other hand, it is known that application of force in a direction that is neither parallel nor perpendicular to the stretching axis of the polylactic acid piezoelectric fibers, i.e., shearing stress, produces polarization, thereby exhibiting the function as a piezoelectric body.

PTL 4 discloses a fiber-like piezoelectric element that allows electrical output to be extracted from the relatively small applied stress of rubbing the surface with a finger. In PTL 4, carbon fiber is used as the conductive fiber for the constituent element of the fiber-like piezoelectric element. However, when this fiber-like piezoelectric element is applied for purposes requiring repeated durability, the weak flexural rigidity of the carbon fiber results in gradual breaking of the fiber, making it impossible to obtain quantitative piezoelectricity and potentially causing the piezoelectric property to gradually decrease. In addition, when it is attempted to obtain height or shape information of an object to be measured using a braided piezoelectric element as the contact probe, the carbon fiber breaks and the tip becomes sharper, and the characteristic rigidity of the carbon fiber can potentially damage the surface of the object to be measured.

In order to solve this problem, the present applicants have previously developed an invention relating to a piezoelectric element comprising a braid comprising a conductive fiber and piezoelectric fibers, the braid being a covered fiber wherein the conductive fiber is the core and the piezoelectric fibers cover the periphery of the conductive fiber, as described in PTL 5. According to invention described therein, a fiber-like piezoelectric element is obtained that can extract electrical output by relatively small applied stress, and yet further improvement is still desired from the standpoint of electrical output.

CITATION LIST

Patent Literature

[PTL 1] JP 2001-189792
[PTL 2] JP 2011-253517
[PTL 3] JP 3540208 B2
[PTL 4] WO 2014/058077
[PTL 5] WO 2016/175321

SUMMARY

Technical Problem

The present invention has been accomplished in light of this background, and its object is to provide a piezoelectric structure that allows a large electrical signal to be extracted even by stress generated with relatively small deformation, as well as a device using the same.

Solution to Problem

As a result of ardent research directed toward achieving the above object, the present inventors have completed this invention upon finding that when a piezoelectric structure is formed having a specific structure using braided coated fiber, as a combination of a conductive fiber and a piezoelectric polymer wherein the surface of the conductive fiber serving as the core is covered with the piezoelectric polymer, it is possible to extract a larger electrical signal than with a conventional piezoelectric element.

Specifically, the present invention encompasses the following inventions.

1. A piezoelectric structure comprising a braid composed of a conductive fiber and piezoelectric fibers, the braid being a covered fiber with the conductive fiber as the core and the piezoelectric fibers covering the periphery of the conductive fiber, wherein the covered fiber has at least one bent section, and when the piezoelectric structure is placed on a horizontal surface, the height from the horizontal surface to the uppermost section of the piezoelectric structure is greater than the diameter of the covered fiber.

2. The piezoelectric structure according to 1, above, wherein the height from the horizontal surface to the uppermost section of the piezoelectric structure is at least twice the diameter of the covered fiber.

3. The piezoelectric structure according to 1, or 2, above, wherein the covered fiber has one or more knots at any desired locations.

4. The piezoelectric structure according to any one of 1, to 3, above, wherein the knots are selected from the group consisting of decorative knots, rope knots and combinations thereof.

5. The piezoelectric structure according to 4, above, wherein the knots are decorative knots, and the decorative knots are selected from the group consisting of half hitch knots, kissho knots, tsuyu knots, 15-angled star knots, myoga knots, chrysanthemum knots, and combinations thereof.

6. The piezoelectric structure according to any one of 1, to 5, above, wherein the flexural rigidity of the conductive fiber is no greater than $0.05 \times 10^{-4}$ N·m²/m.

7. The piezoelectric structure according to any one of 1, to 6, above, wherein the conductive fiber is a metal coated organic fiber.

8. The piezoelectric structure according to any one of 1, to 7, above, wherein the piezoelectric fibers include polylactic acid as the main component.

9. The piezoelectric structure according to 8, above, wherein the piezoelectric fibers include mainly poly-L-lactic acid or poly-D-lactic acid with an optical purity of 99% or greater.

10. The piezoelectric structure according to any one of 1, to 9, above, wherein the piezoelectric fibers are uniaxially oriented and include crystals.

11. The piezoelectric structure according to any one of 1, to 10, above, which detects the size of stress applied to the covered fiber and/or the location at which it is applied.

12. The piezoelectric structure according to 11, above, wherein the stress to be detected is frictional force between the surface of the covered fiber and the surface of the contacting object.

13. The piezoelectric structure according to 11, above, wherein the stress to be detected is resistance in the direction perpendicular to the surface or tip section of the covered fiber.

14. The piezoelectric structure according to any one of 1, to 13, above, wherein the covered fiber outputs an electrical signal by elongation deformation.

15. The piezoelectric structure according to any one of 1, to 14, above, wherein the covered fiber has a core formed of conductive fiber, and a sheath formed of braided piezoelectric fibers covering the core.

16. The piezoelectric structure according to 15, above, wherein the piezoelectric fibers are of a piezoelectric polymer including as the main component a crystalline polymer having an absolute value of between 0.1 pC/N and 1000 pC/N for the piezoelectric constant $d_{14}$, when the orientation axis is the third axis, the orientation angle of the piezoelectric polymer with respect to the direction of the central axis of the core covered by the piezoelectric polymer is between 15° and 75°, and the piezoelectric polymer includes a P-body containing a crystalline polymer with a positive piezoelectric constant $d_{14}$ value as a main component and an N-body containing a crystalline polymer with a negative value as a main component, wherein for a portion of the central axis having a length of 1 cm, the value of T1/T2 is between 0 and 0.8, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

17. The piezoelectric structure according to any one of 1, to 16, above, wherein the insulating fibers further cover the periphery of the conductive fiber.

18. The piezoelectric structure according to 17, above, wherein the piezoelectric fibers are coiled around the periphery of the conductive fiber in the Z-twisting direction and the insulating fibers are coiled around the periphery of the conductive fiber in the S-twisting direction, or the piezoelectric fibers are coiled around the periphery of the conductive fiber in the S-twisting direction and the insulating fibers are coiled around the periphery of the conductive fiber in the Z-twisting direction.

19. The piezoelectric structure according to any one of 1, to 18, above, further provided with a layer composed of conductive fiber on the outside of the covered fiber.

20. A piezoelectric sensor using the piezoelectric structure according to any one of 1, to 19, above.

21. A device comprising:
a piezoelectric sensor according to 20, above,
amplification means that amplifies an electrical signal outputted from the piezoelectric sensor in response to applied pressure, and
output means that outputs the electrical signal amplified by the amplification means.

22. The device according to 21, above, further comprising transmission means that transmits the electrical signal outputted from the output means, to an external device.

23. A device comprising:
the piezoelectric sensor according to 20, above.
output means that outputs an electrical signal from the piezoelectric sensor in response to applied pressure, and
transmission means that transmits the electrical signal outputted from the output means, to an external device.

Advantageous Effects of Invention

According to the invention, it is possible to provide a piezoelectric structure that allows a large electrical signal to be extracted even by stress generated with relatively small deformation, as well as a device using the same. In a piezoelectric structure with formation of a knot such as a decorative knot, it is possible to not only extract a larger electrical signal compared to a conventional piezoelectric element composed of a covered fiber without formation of a knot, but to also increase the aesthetic quality (design property) as a piezoelectric structure. Such a piezoelectric structure, therefore, can be applied across a wide scope even in technical fields that require high design properties.

BRIEF DESCRIPTION OF DRAWINGS

FIG. 10(a) is a photograph showing a choker as a piezoelectric structure that includes a combination of a kissho knot and a tsuyu knot.

DESCRIPTION OF EMBODIMENTS

The principle by which an electrical signal is generated in a combination of a conductive fiber and piezoelectric fibers of the invention will be explained first.

Figure 1A:
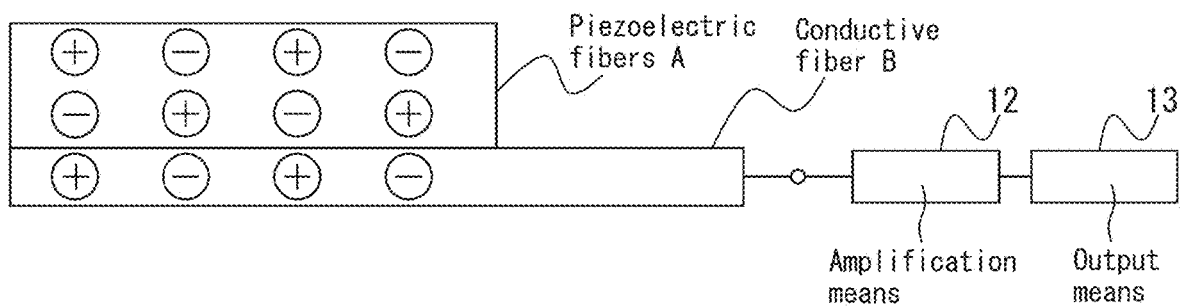
FIGS. 1(a) to 1(c) are schematic cross-sectional views illustrating the principle by which an electrical signal is generated by a combination of conductive fiber and piezoelectric fibers.
Figure 1B:
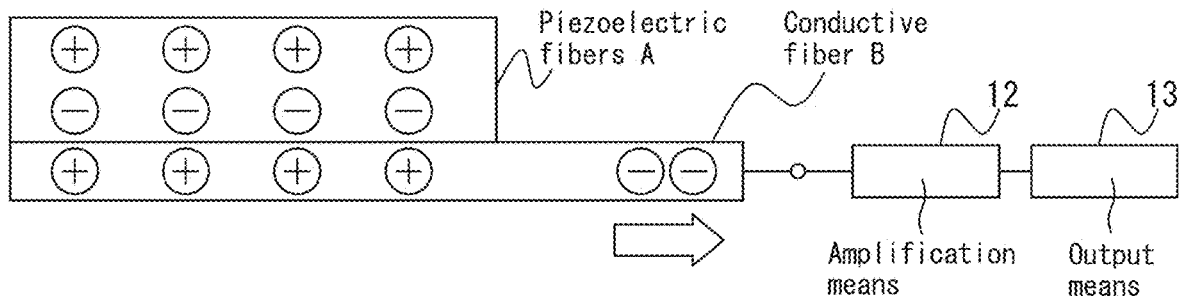
Figure 1C:
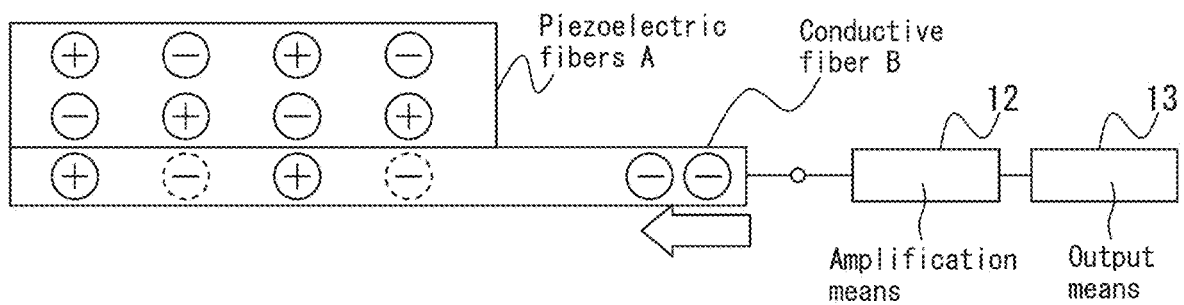

FIGS. 1(a) to 1(c) are a set of schematic cross-sectional views illustrating the principle by which an electrical signal is generated by a conductive fiber and piezoelectric fiber combination. A lead wire is connected from the conductive fiber B to the input terminal of amplification means 12. In FIG. 1(a), which is the state in which the conductive fiber B and the piezoelectric fibers A are in a state with no external force being applied, positive and negative electrical charges are evenly distributed in the conductive fiber B and the piezoelectric fibers A. When an external force begins to be applied to the piezoelectric fibers A, as shown in FIG. 1(b), polarization is generated in the piezoelectric fibers A, and the signs of the electrical charges become oriented in each direction. A negative electrical charge flows out from the conductive fiber B, being drawn by the orientation of the positive and negative electrical charges generated by polarization of the piezoelectric fibers A. Movement of the negative charge manifests as flow of a minute electrical signal (i.e., current), and the amplification means 12 amplifies the electrical signal while output means 13 outputs the electrical signal amplified by the amplification means 12. The state of polarization shown in FIG. 1(b) continues so long as the external force is maintained (fixed) on the piezoelectric fibers A.

When reduction in external force on the piezoelectric fibers A begins from the state in which the external force is maintained (fixed) on the piezoelectric fibers A (FIG. 1(b)), the polarization at the piezoelectric fibers A is canceled, as shown in FIG. 1(c), and the positive and negative electrical charges in the piezoelectric fibers A are in an evenly dispersed state. A negative charge then flows to the conductive fiber B, drawn by the even distribution of positive and negative electrical charges in the piezoelectric fibers A. Movement of the negative charge manifests as flow of a minute electrical signal (i.e., current), but the electrical signal is amplified by the amplification means 12, and the amplified electrical signal is outputted by the output means 13. Since the direction of motion of the negative charge is opposite in the state of movement in which external force is increasing on the piezoelectric fibers A (FIG. 1(*b*)) and the state in which the external force is decreasing from the external force-applied state (FIG. 1(*c*)), electrical signals of opposite polarity are generated with the movement of increasing external force and with the movement of decreasing external force. For example, a positive electrical signal is generated during elongation movement of the piezoelectric fibers A, while a negative electrical signal is generated during return movement of the piezoelectric fibers A.

According to the invention, minute electrical signals generated with elongation and return movement of the piezoelectric fibers A are amplified by the amplification means 12 and outputted by the output means 12, and computation processing by an external device (not shown) ascertains whether the amplified electrical signal is positive or negative and detects the presence of elongation and the degree of elongation of the piezoelectric fibers A. In the external device (not shown), for example, it is possible to carry out computation processing whereby the amplified electrical signals amplified by the amplification means 12 and outputted from the output means 13 are time-integrated, and if the integral value is at least a prescribed upper limit it is assessed as "elongation movement", or if it is less than a prescribed lower limit it is assessed as "return movement". Throughout the present specification, a reference to an electrical signal being generated in response to stress applied to the piezoelectric fibers A is synonymous with the electrical signal being generated in response to distortion of the piezoelectric fibers A.

The present invention will now be described in detail.
(Piezoelectric structure)

Figure 2A:
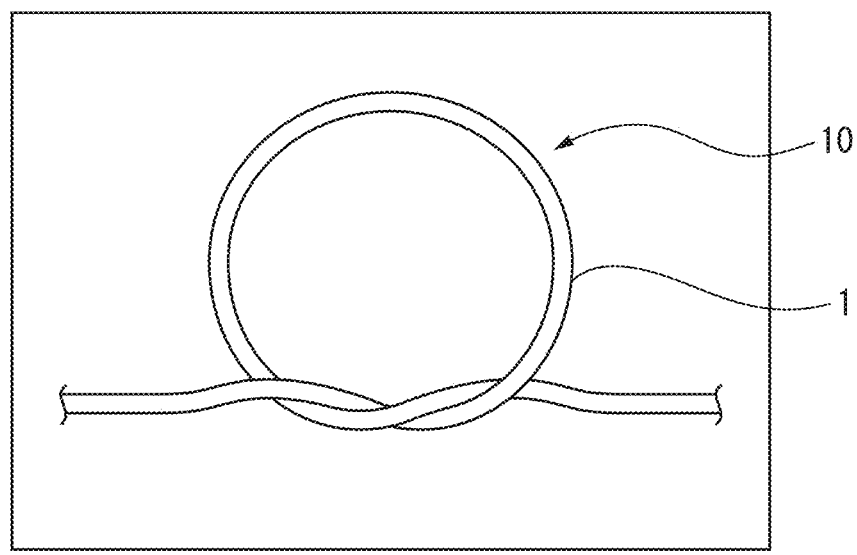
FIGS. 2(a) and 2(b) are schematic diagrams showing an example of the construction of a piezoelectric structure according to an embodiment of the invention.
Figure 2B:

The piezoelectric structure of the invention includes a braid composed of a conductive fiber and piezoelectric fibers, the braid being a covered fiber with the conductive fiber as the core and the piezoelectric fibers covering the periphery of the conductive fiber, wherein the covered fiber has at least one bent section, and when the piezoelectric structure is placed on a horizontal surface, the height from the horizontal surface to the uppermost section of the piezoelectric structure is greater than the diameter of the covered fiber. FIGS. 2(*a*) and 2(*b*) are a pair of schematic diagrams representing an example of the construction of a piezoelectric structure according to an embodiment of the invention, FIG. 2(*a*) showing the top view and FIG. 2(*b*) showing a side view.

Referring to FIG. 2(*a*), the piezoelectric structure 10 is composed of a covered fiber 1, described in detail below, and more specifically it has a structure provided with a knot so that a bent section is formed in the covered fiber 1. When the piezoelectric structure 10 is placed on a horizontal surface, the height h from the horizontal surface to the uppermost section of the piezoelectric structure 10 is larger than the diameter of the covered fiber 1, as shown in FIG. 2(*b*). In this case, as shown in FIG. 2(*b*), at the knot portion the covered fiber 1 has its fiber axis oriented in multiple directions different from the direction parallel to the horizontal surface. When stress is applied to the piezoelectric structure 10 from the direction perpendicular to the horizontal surface, for example, deformation is produced by multiple elongations in the covered fiber 1 at the knot portion, and the multiple elongation deformations generate multiple electrical signals in the piezoelectric structure 10. In addition, since the piezoelectric structure 10 has its fiber axis oriented in multiple directions as mentioned above, elongation deformation can be produced in response not only to stress from the direction perpendicular to the horizontal surface but also to stress from a number of other directions, thus generating electrical signals. Furthermore, the electrical signals generated by the multiple elongation deformations are definitely larger than the electrical signal generated by a single elongation deformation. Since the knot portion is constrained in a complex manner, stress is concentrated locally from stress in specific directions, often resulting in a larger generated electrical signal. With the piezoelectric structure of the invention having such a construction, therefore, it is possible to reliably extract a larger electrical signal by stress produced by relatively small deformation. Furthermore, since the piezoelectric structure 10 has its fiber axis oriented in multiple directions, the manner and degree of elongation deformation may vary greatly depending on the direction and strength of applied stress. Since the strength and behavior of the outputted signal will also vary in this case, it is possible to distinguish the movements of applied stress.

When a single covered fiber 1 is simply placed on a horizontal surface, on the other hand, elongation deformation can be produced by pulling of both ends of the covered fiber 1, for example, but adequate elongation deformation cannot be produced in response to stress from various other directions, such as stress from a direction not parallel to the horizontal surface. Moreover, when a single covered fiber 1 is simply placed on a horizontal surface, it is difficult to simultaneously produce multiple elongation deformations in response to a single stress application, unlike with the piezoelectric structure of the invention. With the piezoelectric structure of the invention, therefore, a larger electrical signal can be extracted than with a piezoelectric element made of a conventional covered fiber.

A construction with a knot is shown as the piezoelectric structure of the invention in FIGS. 2(*a*) and 2(*b*) for easier understanding, but the piezoelectric structure of the invention is not limited to such a construction. That is, the piezoelectric structure of the invention may include any structure wherein the covered fiber has one or more bent sections, and preferably two, three or more bent sections, and the height from the horizontal surface to the uppermost section of the piezoelectric structure when the piezoelectric structure is placed on a horizontal surface is greater than the diameter of the covered fiber. For example, the piezoelectric structure of the invention includes structures wherein a bent section is simply formed in the covered fiber and the bent section is then fixed with an adhesive or the like to maintain the structure.

According to the invention, the height from the horizontal surface to the uppermost section of the piezoelectric structure 10 is not particularly restricted so long as it is greater than the diameter of the covered fiber 1, but it is preferably at least twice and more preferably at least 3 times the diameter of the covered fiber 1. If the piezoelectric structure 10 has a height of such greater magnitude, it will be possible to further increase the slope of the fiber axis of the covered fiber 1 with respect to the surface on which the piezoelectric structure 10 is placed. Therefore, a larger degree of elongation deformation can be produced in the covered fiber 1 in response to application of stress onto the piezoelectric structure 10 from a specific direction, such as application of stress from the direction perpendicular to the horizontal surface, and a larger electrical signal can be extracted from the piezoelectric structure 10 as a result. Moreover, with appropriate combination of the height from the horizontal surface to the uppermost section of the piezoelectric structure 10 and the number of bent sections of the covered fiber 1, it is possible to extract larger electrical signals from multiple covered fibers 1 to extract a very large electrical signal overall by relatively small deformation.

According to the invention, the "diameter of the covered fiber" is the diameter of the narrowest portion of the covered fiber forming the piezoelectric structure.

In the piezoelectric structure 10 of the invention, the covered fiber 1 preferably has one or more knots at any locations. By providing knots without using an adhesive or the like, it is possible to more easily form a piezoelectric structure 10 wherein the covered fiber 1 has one or more bent sections and the height from the horizontal surface to the uppermost section of the piezoelectric structure 10 is greater than the diameter of the covered fiber 1. More preferably, the covered fiber 1 has 2, 3, 4 or more knots at desired locations. By increasing the number of knots it is possible to form a piezoelectric structure 10 including numerous covered fibers 1 having fiber axes oriented in various directions. As a result it is possible to simultaneously produce multiple elongation deformations in response to a single application of stress, to extract a very large electrical signal overall.

The knots employed may be any knots that are publicly known to those skilled in the art without any particular restrictions, examples including any selected from the group consisting of decorative knots, rope knots, and combinations thereof.

Examples of decorative knots that may be employed include the decorative knots mentioned in "Illustrated Introduction to Decorative Knots, 1st Revised Edition" by Kawashima, Misono, Suiyosha Publishing, and specifically, awaji knot (top right), awaji knot (top left), aoi knot (single thread movement/counterclockwise), aoi knot (single thread movement/clockwise), four-hand awaji knot, shogon knot, keman knot, honganji knot (turtle knot), swastika knot (right agemaki knot), swastika knot (left agemaki knot), chrysanthemum knot, chrysanthemum knot (kusabi knot), rear chrysanthemum knot, twelve-piece chrysanthemum knot, yae chrysanthemum knot, ume knot, bow knot 1, bow knot 2, button knot (shakato), thread knot, four-diamond knot, aioi knot, kamikazari knot, 10-angled star knot, 15-angled star knot, six-way knot, kichou knot, two-leaf knot, three-leaf knot, plum flower knot, tsuyu knot (right/male knot), tsuyu knot (left/female knot), kawarikoma knot (horizontal), kawarikoma knot (vertical), buckaroo knot, single sheet bend, tsuno knot (round), tsuno knot (square), kesa knot, tassel knot (horizontal), tassel knot (vertical), Pan Chang knot, plafond knot, flat knit (3), flat knit (4), flat knit (5), uroko knit (flat 7), uroko knit (flat 9), cable stitch (flat), square knit (4), square knit (6), square knit (8), round knit (4), round knit (6), left-right knot, nina knot, chain knot, doubled four-hand awaji knot, awaji tsunagi knot, doubled awaji knot, double thread knot, triangular tsunaami knot, square tsunaami knot, tsunaami knot rectangular, kazaguruma knot, kazaguruma knot (single thread movement), doubled kichou knot (upper triangle), doubled kichou tsunagi knot (lower triangle), mitsui knot, myoga knot, butterfly knot (upward), butterfly knot (downward). Pan Chang knot triangle (upward). Pan Chang knot triangle (downward), Pan Chang knot variation (ryoka knot), long figure-eight knot, lateral figure-eight knot, square tsunaami knot (two-way), long plafond knot, lateral plafond knot, double tassel knot, taiyo knot, ring taiyo knot, kounkasa knot, fan Pan Chang knot, cow hitch knot, flat knot, shippo knot (single flat knot), shippo knot (single half-flat knot), clove hitch knot, surface touching knot, top left twist knot, top right twist knot, figure-eight knot, overhand knot and matome knot (wrapping). According to the invention, decorative knots selected from the group consisting of half hitch knots, kissho knots, tsuyu knots, 15-angled star knots, myoga knots, chrysanthemum knots, for example, and combinations thereof, may be used.

Examples of rope knots include the rope knots mentioned in "Illustrated New Rope Knot Tying" Sugiura Akinori, Kaibundo Publishing, and specifically, single knot, figure-eight knot, half-hitch knot, twist knot, clove hitch knot, double knot, bowline knot, koshikake knot, ring knot, middleman knot, sheepshank knot, mamusubi knot, single tie, aya tie, omoimusubi knot, keman knot, agemaki knot, rod knot, hobaku knot, handle knots (crown knot, wall knot, wall and crown knot, Matthew Walker knot, diamond knot, 6-strand handle knot) and taga knots (3-side 3-rope turks head, 4-side 3-rope turks head, 5-side 3-rope turks head, multiside 3-rope turks head, 4-rope turks head). The specific types of decorative knots and rope knots can be easily formed based on the descriptions found in the aforementioned publications.

A plurality of covered fibers may be bundled for use in the piezoelectric structure of the invention, and for example, the covered fiber may be covered with another fiber or layer so that the diameter of the covered fiber is an appropriate size, and several covered fibers obtained in this manner may be bundled for use. Particularly in the case of a piezoelectric structure including a covered fiber having such a decorative knot, a covered fiber, either alone or as a bundle of several, having the periphery covered with fibers or a layer having various other shapes (for example, braided or covering thread-like) or colors, may be used so that a piezoelectric structure with a high design property can be obtained. In this case, all of the cord forming the decorative knot may consist of the piezoelectric covered fiber, or the piezoelectric covered fiber may be used for only a portion of the cord.

(Covered Fiber)

Figure 3:
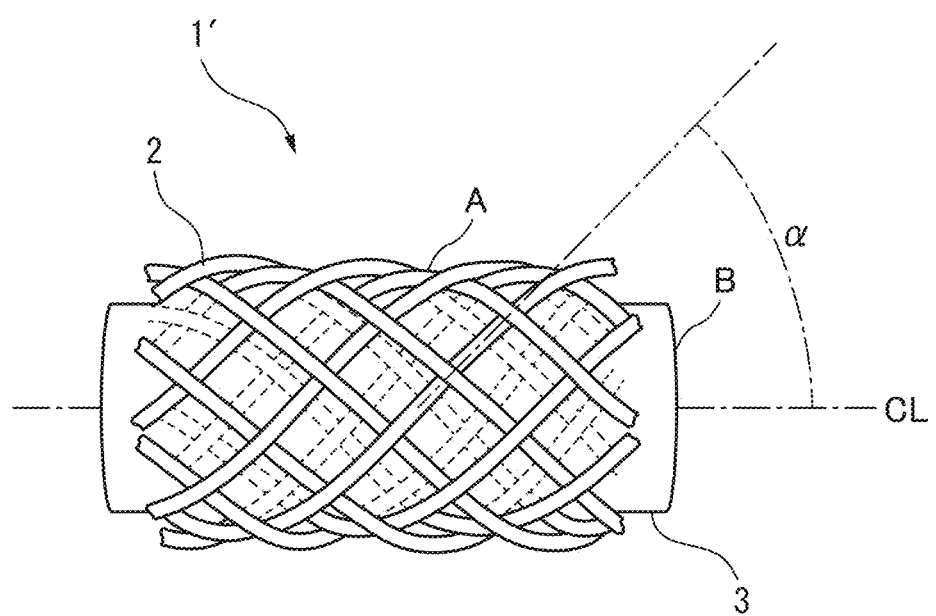
FIG. 3 is a schematic diagram showing an example of the preferred construction of a covered fiber according to an embodiment of the invention.

The piezoelectric structure of the invention includes a covered fiber that has the surface of a conductive fiber covered with fibers of a piezoelectric polymer, i.e., piezoelectric fibers. FIG. 3 is a schematic diagram showing an example of the preferred construction of a covered fiber according to an embodiment of the invention. As shown in FIG. 3, the covered fiber 1' comprises a core 3 formed of a conductive fiber B and a sheath 2 formed of braided piezoelectric fibers A covering the core 3. FIG. 3 shows a braided covered fiber 1' as an example of the preferred construction of the covered fiber 1 as mentioned above, but the covered fiber 1 of the invention is not limited to this type of braided covered fiber 1' and it may include any form of braid comprising a conductive fiber and piezoelectric fibers. A braided covered fiber 1' as an example of a preferred construction of the covered fiber 1 will now be described in greater detail.

In the braided covered fiber 1', a plurality of piezoelectric fibers A are closely coiled around the outer peripheral surface of at least one conductive fiber B. It is surmised that when deformation is produced in the braided covered fiber 1', stress is produced in each of the piezoelectric fibers A by the deformation, producing an electric field in each of the piezoelectric fibers A (piezoelectric effect), and as a result a voltage change takes place in the conductive fiber B, superimposed on the electric field of the plurality of piezoelectric fibers A coiled around the conductive fiber B. That is, the electrical signal from the conductive fiber B is augmented compared to when the braided sheath 2 of piezoelectric fibers A is not used. This allows a large electrical signal to be extracted with the braided covered fiber 1', even by stress produced by relatively small deformation. Incidentally, the conductive fiber B may also consist of a plurality of fibers.

The braided covered fiber 1' is preferably one that selectively outputs a large electrical signal in response to elongation deformation in the direction of its central axis (CL in FIG. 3).

(Braided Covered Fiber Selectively Outputting Large Electrical Signal in Response to Elongation Deformation)

The braided covered fiber 1' that selectively outputs a large electrical signal in response to elongation deformation in the central axis direction may be one wherein, for example, the piezoelectric fibers A used are molded from a uniaxially oriented polymer, which is a piezoelectric polymer including, as a main component, a crystalline polymer having an absolute value of between 0.1 pC/N and 1000 pC/N for the piezoelectric constant d14 when the orientation axis is the third axis. According to the invention, "including . . . as the main component" means that the constituent component constitutes 50 mass % or greater. For the purpose of the invention, a crystalline polymer is a polymer comprising a crystalline portion at 1 mass % or greater, and also comprising an amorphous portion in addition to the crystalline portion, where the mass of the crystalline polymer is its total mass including the crystalline portion and the amorphous portion. Incidentally, while different values are obtained for d14 depending on the molding conditions, purity and measuring atmosphere, according to the present invention it is sufficient if, based on measurement of the degree of crystallinity and crystal orientation of the crystalline polymer measured for the piezoelectric polymer that is actually used, the absolute value of d14 for the film is between 0.1 pC/N and 1000 pC/N at the temperature of actual use, when a uniaxially stretched film having the same degree of crystallinity and crystal orientation is fabricated using the crystalline polymer, and the crystalline polymer in the piezoelectric polymer of this embodiment is not limited to specific crystalline polymers such as those mentioned below. Measurement of d14 for a film sample may be made by a publicly known method, and for example, a sample having metal vapor deposited electrodes on both sides of the film sample may be cut out into a 4-sided rectangular shape in a direction inclined 45⁰ from the stretching direction, and the electrical charge generated at the electrodes on both sides may be measured under a tensile load in the longitudinal direction, to measure the d14 value.

In the braided covered fiber 1' that selectively outputs a large electrical signal in response to elongation deformation in the central axis direction, preferably the angle formed between the central axis direction and the direction of orientation of the piezoelectric polymer (the orientation angle θ) is between 15° and 75°. When this condition is satisfied, application of elongation deformation (tensile stress and compression stress) in the central axis direction with respect to the braided covered fiber 1' allows efficient utilization of the piezoelectric effect corresponding to the piezoelectric constant d14 of the crystalline polymer in the piezoelectric polymer, and allows electrical charges of opposite polarity (reverse signs) to be efficiently generated on the central axis side and the outside of the braided covered fiber 1'. From this viewpoint, the orientation angle θ is preferably between 25° and 65°, more preferably between 35° and 55° and even more preferably between 40° and 50°. Such an arrangement of the piezoelectric polymer will cause the direction of orientation of the piezoelectric polymer to manifest as a helix.

Such an arrangement of the piezoelectric polymer will also allow a braided covered fiber 1' to be obtained that avoids generating large electrical charge on the central axis side and the outside of the covered fiber 1 in response to shear deformation which rubs against the surface of the braided covered fiber 1', or to bending deformation which bends the central axis, or to twisting deformation around the central axis, or in other words, that selectively generates a large electrical charge in response to elongation in the central axis direction.

Figure 4:
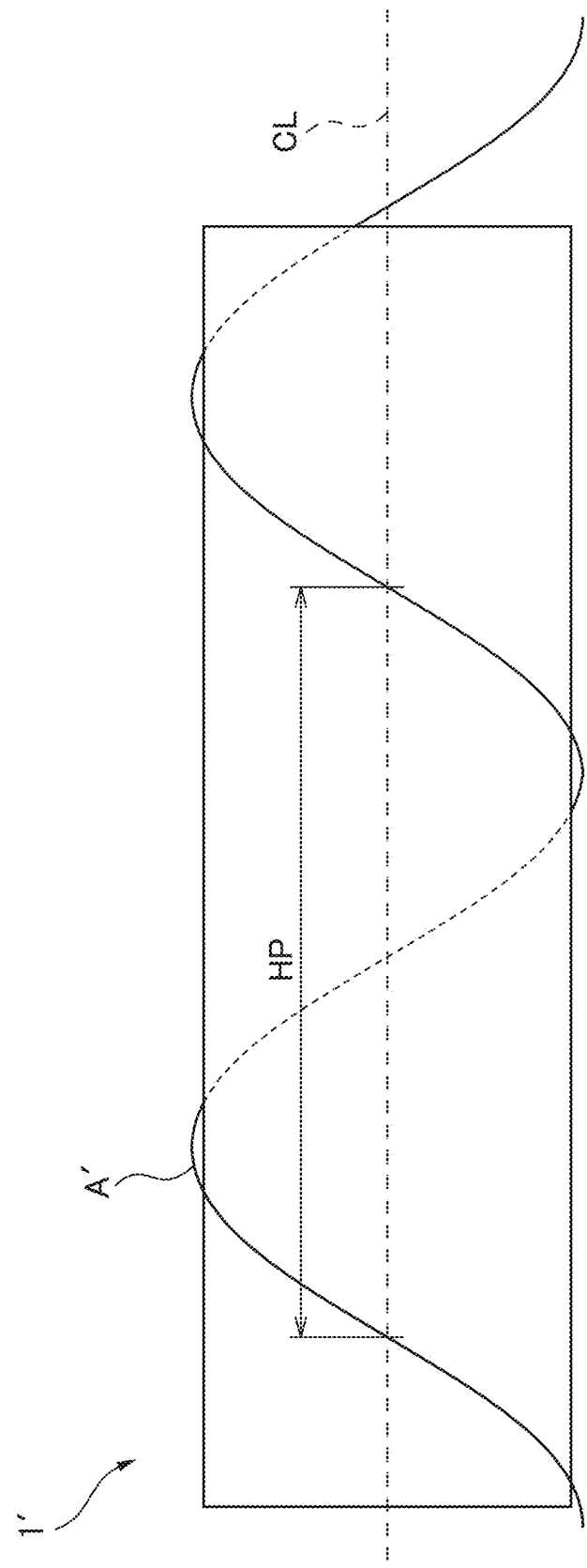
FIG. 4 is a schematic diagram illustrating a method of calculating the orientation angle θ.

The orientation angle θ is measured by the following method when possible. A side photograph of the braided covered fiber 1' is taken, and the helical pitch HP of the piezoelectric polymer A' is measured. As shown in FIG. 4, the helical pitch HP is the linear distance in the central axis direction that is required for one piezoelectric polymer A' to extend from the front side around the back side and return again to the front side. After the structure is anchored with an adhesive if necessary, a cross-section is cut out perpendicular to the central axis of the braided covered fiber 1' and photographed, and the outer radius Ro and inner radius Ri are measured at the portion occupied by the sheath 2. When the outer edge and inner edge of the cross-section are elliptical or flattened circular, Ro and Ri are the average values of the long diameter and short diameter, respectively. The orientation angle θ of the piezoelectric polymer with respect to the direction of the central axis is calculated by the following formula.

$$\theta = \arctan(2\pi Rm/HP)(0° \leq \theta \leq 90°)$$

Here, $Rm=2(Ro^3-Ri^3)/3(Ro^2-Ri^2)$, i.e., the radius of the covered fiber 1 as a weighted average based on the cross-sectional area.

When the piezoelectric polymer has a uniform surface in a side photograph of the covered fiber 1, such that the helical pitch of the piezoelectric polymer cannot be distinguished, the braided covered fiber 1' anchored with the adhesive is cross-cut on a plane running through the central axis, and wide-angle X-ray diffraction analysis is performed with X-ray transmission in the direction perpendicular to the cross-cut surface, in a sufficiently narrow range running through the central axis, determining the orientation direction and measuring its angle with the central axis as θ.

In the case of the braided covered fiber 1' of the invention, the helix manifesting along the direction of orientation of the piezoelectric polymer will sometimes consist of two or more simultaneously present helices with different helical directions (S-twisting direction or Z-twisting direction) or helical pitches, in which case each piezoelectric polymer having a different helical direction and helical pitch is measured, and it is necessary for the piezoelectric polymer of one helical direction and helical pitch to satisfy the aforementioned condition.

The charge polarity generated on the central axis side and the outside in response to elongation deformation in the central axis direction is mutually opposite when the direction of orientation of the piezoelectric polymer is situated along an S-twisted helix and when the direction of orientation of the piezoelectric polymer is situated along a Z-twisted helix. Therefore, if the direction of orientation of the piezoelectric polymer is situated along an S-twisted helix while also being situated along a Z-twisted helix, the charges generated in response to elongation deformation will cancel each other out in the S-twisting direction and the Z-twisting direction, which is undesirable as it will prevent efficient utilization. Therefore, the piezoelectric polymer includes a P-body containing a crystalline polymer with a positive piezoelectric constant d14 value as the main component and an N-body containing a crystalline polymer with a negative value as the main component, wherein for a portion of the central axis of the covered fiber 1 having a length of 1 cm, the value of T1/T2 is preferably between 0 and 0.8 and more preferably between 0 and 0.5, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

When fibers including polylactic acid are used as the main component for the piezoelectric fibers of the invention, the polylactic acid contains the lactic acid unit in a proportion of preferably at least 90 mol %, more preferably at least 95 mol % and even more preferably at least 98 mol %.

In the braided covered fiber 1', so long as the purpose of the invention is achieved, combined filaments may be prepared in combination with fibers other than the piezoelectric fibers A for the sheath 2, and combined filaments may be prepared in combination with fibers other than the conductive fiber B for the core 3.

The length of the covered fiber 1 or braided covered fiber 1' is not particularly restricted, and it may be continuously produced during production and cut to the desired length thereafter. For use as an actual piezoelectric structure, the length of the covered fiber 1 or braided covered fiber 1' is 1 mm to 20 m, preferably 1 cm to 10 m and more preferably 10 cm to 5 m. An excessively short length may be disadvantageous for forming the piezoelectric structure, while an excessively long length may lead to problems such as low electrical output, due to issues relating to the resistance value of the conductive fiber B.

Each of the structural aspects will now be explained in greater detail.

(Conductive Fiber)

The conductive fiber B used may be any publicly known one that exhibits conductivity. Examples for the conductive fiber B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of whether it has or lacks conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber B, the conductive fiber will be very highly unlikely to break and the durability and safety of a sensor using the piezoelectric structure will be excellent.

The conductive fiber B used may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 µm to 5000 µm and preferably 2 µm to 100 µm. It is more preferably 3 µm to 50 µm. In the case of a multifilament, the number of filaments is preferably from 1 to 100,000, more preferably 5 to 500 and even more preferably 10 to 100. The fineness and number of conductive fibers B is the fineness and number of cores 3 used to prepare the braid, and a multifilament formed of a plurality of single threads (monofilaments) is counted as one conductive fiber B. The core 3 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber B is preferably circular or elliptical from the viewpoint of design and production of the covered fiber, but this is not limitative.

A lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber B is not limited thereto so long as sufficient strength can be obtained for detection of the electrical signal.

For use according to the present invention, the conductive fiber B must be resistant to movements such as repeated bending and twisting. As one indicator of such a property, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAXR HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Piezoelectric Fibers)

The piezoelectric polymer used as the material for the piezoelectric fibers A may be a polymer exhibiting piezoelectricity such as polyvinylidene fluoride or polylactic acid, but the piezoelectric fibers A described above for this embodiment preferably include a crystalline polymer with a high absolute value for the piezoelectric constant d14 when the orientation axis is the third axis, and especially polylactic acid, as the main component. Polylactic acid is easily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization in response to the same stress, they may be used in combination depending on the purpose.

The optical purity of the polylactic acid is preferably 99% or greater, more preferably 99.3% or higher and even more preferably 99.5% or higher. If the optical purity is less than 99% the piezoelectric modulus may be significantly lowered, potentially making it difficult to obtain a sufficient electrical signal by shape deformation of the piezoelectric fibers A. Most preferably, the piezoelectric fibers A include poly-L-lactic acid or poly-D-lactic acid as the main component, with an optical purity of 99% or greater.

Piezoelectric fibers A composed mainly of polylactic acid are stretched during production, and are uniaxially oriented in their fiber axis direction. Preferably the piezoelectric fibers A are not only uniaxially oriented in the fiber axis direction but also include polylactic acid crystals, and more preferably they include uniaxially oriented polylactic acid crystals. This is because polylactic acid exhibits higher piezoelectricity and has a higher absolute value for d14 by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and even more preferably 0.3 or greater. Each of the values is determined in the following manner.

Homopolylactic acid crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used in a transmission method, and the X-ray diffraction pattern of a sample is recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near 2θ=16.5°, 18.5° and 24.3°, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi}/I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2θ=16.5° in the radius vector direction, and it is calculated from the sum $\Sigma W_i$ (°) of the half-widths in the obtained distribution profile, using the following formula (3).

$$\text{Crystal orientation } Ao\ (\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

The piezoelectric fibers A may be multifilaments consisting of bundles of multiple filaments, or a monofilament consisting of a single filament. In the case of monofilaments (including spun yarn), the monofilament diameter is 1 µm to 5 mm, preferably 5 µm to 2 mm and even more preferably 10 µm to 1 mm. In the case of multifilaments, the monofilament diameter is 0.1 µm to 5 mm, preferably 2 µm to 100 µm and even more preferably 3 µm to 50 µm. The number of filaments for a multifilament is preferably from 1 to 100,000, more preferably 50 to 50,000 and even more preferably 100 to 20,000. However, the fineness and number of piezoelectric fibers A is the fineness and number per carrier when preparing the braid, and a multifilament formed of a plurality of single threads (monofilaments) is counted as one piezoelectric fiber A. One carrier includes the overall amount, including fibers other than piezoelectric fibers when they are used.

In order to obtain piezoelectric fibers A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which will facilitate industrial production. After formation of the fibers, the formed fibers may also be stretched. This will form piezoelectric fibers A that are uniaxially stretched and oriented, include crystals, and exhibit high piezoelectricity.

In addition, the piezoelectric fibers A may be treated by dyeing, twisting, doubling, heat treatment or the like, before braiding of the fibers prepared as described above.

In addition, since the piezoelectric fibers A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095 9.10.2. Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

The difference in the shrinkage factor of the piezoelectric fibers is preferably small compared to the shrinkage factor of the conductive fiber mentioned above. If the difference in shrinkage factor is large, then the braid may undergo bending during the post-treatment step after formation of the braid or when it is subjected to heat during use or with time-related changes, thus potentially weakening the piezoelectric signal. If the shrinkage factor is quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)| \leq 10 \quad (4)$$

The left side of inequality (4) is more preferably ≤5 and even more preferably ≤3.

The difference in the shrinkage factor of the piezoelectric fibers is also preferably small compared to the shrinkage factor of the fibers other than the conductive fiber, such as the insulating fibers. If the difference in shrinkage factor is large, then the braid may undergo bending during the post-treatment step after formation of the braid or when it is subjected to heat during use or with time-related changes, thus potentially weakening the piezoelectric signal. When the shrinkage factor is quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)| \leq 10 \quad (5)$$

The left side of inequality (5) is more preferably ≤5 and even more preferably ≤3.

The shrinkage factor of the piezoelectric fibers is also preferably small. For example, when the shrinkage factor is quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting or after braiding. The boiling water shrinkage ratio described above was measured by the following method. A reel with 20 coils was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio}=(L0-L)/L0 \times 100(\%) \quad (6)$$

(Covering)

Each conductive fiber B or core 3 has the surface covered with piezoelectric fibers A formed from a piezoelectric polymer. The thickness of the piezoelectric fiber layer or sheath 2 covering the conductive fiber B is preferably 1 μm to 10 mm, more preferably 5 μm to 5 mm, even more preferably 10 μm to 3 mm and most preferably 20 μm to 1 mm. If it is too thin, problems may result in terms of strength, while if it is too thick, it may be difficult to extract electrical output. In the braided covered fiber 1', the total fineness of the piezoelectric fibers A of the sheath 2 is preferably at least ½ and no greater than 20 times, more preferably at least 1 and no greater than 15 times, and even more preferably at least 2 and no greater than 10 times, the total fineness of the conductive fiber B of the core 3. If the total fineness of the piezoelectric fibers A is too small with respect to the total fineness of the conductive fiber B, there will be too few piezoelectric fibers A surrounding the conductive fiber B and the conductive fiber B will not be able to sufficiently output an electrical signal, while the conductive fiber B may potentially contact with other adjacent conductive fibers. If the total fineness of the piezoelectric fibers A is too large with respect to the total fineness of the conductive fiber B, there will be too many piezoelectric fibers A surrounding the conductive fiber B, and the braided covered fiber 1' will become too hard and resistant to deformation. In other words, the piezoelectric structure 10 will fail to adequately function as a sensor in both cases.

The total fineness referred to here is the sum of all of the finenesses of the piezoelectric fibers A composing the sheath 2, and in the case of a common 8-strand braid, for example, it is the sum of the finenesses of the 8 strands.

Also, in the braided covered fiber F, the fineness per piezoelectric fiber A of the sheath 2 is preferably at least ¹⁄₂₀ times and no greater than 2 times, more preferably at least ¹⁄₁₅ times and no greater than 1.5 times, and even more preferably at least ¹⁄₁₀ times and no greater than 1 time, the total fineness of the conductive fiber B. If the fineness per piezoelectric fiber A is too small with respect to the total fineness of the conductive fiber B, there will be too few piezoelectric fibers A and the conductive fiber B will not be able to sufficiently output an electrical signal, while the piezoelectric fibers A may potentially undergo breakage. If the fineness per the piezoelectric fiber A is too large with respect to the total fineness of the conductive fiber B, the piezoelectric fibers A will be too thick and the covered fiber 1 will become too hard and resistant to deformation. In other words, the piezoelectric structure 10 will fail to adequately function as a sensor in both cases.

Incidentally, when metal fiber is used for the conductive fiber B or when metal fiber is combined with the conductive fiber B or piezoelectric fibers A, the fineness proportion is not limited to that mentioned above. This is because according to the invention, the proportion is important from the standpoint of the contact area and coverage factor, i.e., the area and volume. For example, if the specific gravity of each of the fibers exceeds 2, the proportion of the mean cross-sectional area of the fibers is preferably the same as the fineness proportion.

It is preferred for the piezoelectric fibers A and the conductive fiber B to be as closely bonded as possible, but for improved adhesiveness, an anchor layer or adhesive layer may be provided between the conductive fiber B and the piezoelectric fibers A.

The covering method employed is a method of using the conductive fiber B as the core and coiling the piezoelectric fibers A around it. The form of the piezoelectric fibers layer, however, is not particularly restricted so long as electrical output can be extracted in response to applied stress, but in the case of the braided covered fiber F, it is preferably an 8-strand braid or a 16-strand braid with the core 3.

The forms of the conductive fiber B and the piezoelectric fibers A are not particularly restricted, but they are preferably as nearly concentric as possible. When a multifilament is used as the conductive fiber B, the piezoelectric fibers A need only be covering in a manner so that at least a portion of the surface of the multifilament of the conductive fiber B (the peripheral surface of the fiber) is contacting, and the piezoelectric fibers A may cover all, or not all, of the filament surface (peripheral surfaces of the fibers) of the multifilament. The covering state of the piezoelectric fibers A on each filament in the interior forming the multifilament of the conductive fiber B may be set as appropriate, in consideration of performance and handleability of the piezoelectric element.

The covered fiber 1 of the invention includes at least one conductive fiber, but the number of conductive fibers is not limited to one and may be more than one.

Since the covered fiber 1 of the invention has no need for electrodes on its surface, there is no need to further cover the covered fiber 1 itself, while it also has the advantage of being less likely to malfunction.

(Insulating Fibers)

In the covered fiber 1 of the invention, the periphery of the conductive fiber B may be further covered with insulating fibers. More specifically, in the braided covered fiber 1', the sheath 2 may be formed of the piezoelectric fibers A alone, or it may be formed of a combination of the piezoelectric fibers A and insulating fibers. For example, the piezoelectric fibers A may be coiled around the periphery of the conductive fiber B in the Z-twisting direction and the insulating fibers may be coiled around the periphery of the conductive fiber B in the S-twisting direction, or the piezoelectric fibers A may be coiled around the periphery of the conductive fiber B in the S-twisting direction and the insulating fibers may be coiled around the periphery of the conductive fiber B in the Z-twisting direction.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Production Method)

The piezoelectric structure of the invention includes a covered fiber wherein the surface of at least one conductive fiber B is covered with piezoelectric fibers A. The method for producing the covered fiber may be the following. That is, it may be a method of preparing the conductive fiber B and the stretched piezoelectric fibers A in separate steps, and coiling the piezoelectric fibers A around the conductive fiber B to cover it. In this case, the covering is preferably carried out as nearly concentrically as possible.

The preferred spinning and stretching conditions, when using polylactic acid as the piezoelectric polymer forming the piezoelectric fibers A, is a melt spinning temperature of preferably 150 to 250° C., a stretching temperature of preferably 40 to 150° C., a draw ratio of preferably 1.1 to 5.0 and a crystallization temperature of preferably 80 to 170° C.

The piezoelectric fibers A to be used by coiling around the conductive fiber B may be multifilaments consisting of bundles of multiple filaments, or monofilaments (including spun yarn). The conductive fiber B around which the piezoelectric fibers A are to be coiled may also be a multifilament consisting of bundles of multiple filaments, or a monofilament (including spun yarn).

The form of coiling to cover may be, for example, covering by the piezoelectric fibers A in the form of a braided tube, with the conductive fiber B as the core inserted in the braided tube. Alternatively, covering may be by a tubular braid formed with the conductive fiber B as the core filament and the piezoelectric fibers A formed as a braid around its periphery. When the piezoelectric fibers A are used as monofilaments, the monofilament diameter is 1 μm to 5 mm, preferably 5 μm to 2 mm and even more preferably 10 p to 1 mm. When used as a multifilament, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000.

The piezoelectric structure of the invention may be produced by any suitable method using covered fibers produced by the methods described above. For example, after forming one or more bent sections in a covered fiber, the one or more bent sections may be fixed with an adhesive or the like so that the piezoelectric structure supports a three-dimensional structure. Alternatively, according to a preferred embodiment of the invention, one or more knots may be formed at any locations of the covered fiber. Using such a method it is possible, without an adhesive, to more easily form a piezoelectric structure wherein the covered fiber has one or more bent sections and the height from the horizontal surface to the uppermost section of the piezoelectric structure is greater than the diameter of the covered fiber. Knots may be formed by any known knot-forming method, either forming several of the same types of knots, or forming different types of knots. Knot methods that are publicly known including decorative knots and rope knots, as well as their combinations, which may be employed as appropriate. For example, any of the decorative knots mentioned in "Illustrated Introduction to Decorative Knots, 1st Revised Edition" by Kawashima. Misono, Suiyosha Publishing, or the rope knots mentioned in "Illustrated New Rope Knot Tying" Sugiura Akinori, Kaibundo Publishing, may be used, and the specific knots can be easily formed based on the descriptions found in those publications. These knots can also be formed using covered fibers having their peripheries covered with fibers or layers of different forms (for example, braided or covering thread-like) and colors, either alone or in bundles. Such covered fibers may be formed by wrapping the periphery of covered fibers with fibers of different colors, in a braided or covering thread-like fashion, or they may be formed by inserting a covered fiber of the invention into a braided form or a covering thread-like braid.

(Protective Layer)

A protective layer may also be provided on the outer surface of the covered fiber 1 of the invention. The protective layer preferably has an insulating property, and from the viewpoint of flexibility it is more preferably composed of a polymer. When the protective layer is given an insulating property, naturally the protective layer will also be deformed and the protective layer will be rubbed, but there are no particular restrictions so long as the external force reaches the piezoelectric fibers A and can induce polarization. The protective layer is not limited to being formed by coating of the polymer or the like, and it may instead be a coiled film, fabric, fiber or the like, or a combination of these.

The thickness of the protective layer is as small as possible to facilitate transmission of shearing stress to the piezoelectric fibers A, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm.

In order to reduce noise, an electromagnetic shield layer may also be provided on the outside of the covered fiber 1. The electromagnetic shield layer is not particularly restricted, but a conductive substance may be coated, or a conductive film, fabric, fiber or the like may be coiled. The volume resistivity of the electromagnetic shield layer is preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of the electromagnetic shield layer can be obtained. The electromagnetic shield layer may be provided on the surface of the piezoelectric fibers A of the sheath, or it may be provided on the outer side of the aforementioned protective layer. Naturally, multiple layers of the electromagnetic shield layer and protective layer may be overlaid, their order being suitably determined according to the purpose.

In addition, a plurality of layers made of piezoelectric fibers may be provided, or a plurality of layers made of conductive fibers for signal extraction may be provided. Naturally, the number and order of the protective layer, the electromagnetic shield layer, the layer made of piezoelectric fibers and the layer made of conductive fibers, may be determined as appropriate according to the purpose. The method of coiling may be, in the case of a braided covered fiber 1', for example, further forming a braid structure on the outer layer of the sheath 2, or using it for covering.

(Function)

The piezoelectric structure of the invention allows an electrical output to be extracted by pressing, rubbing or shaking the surface, as long as shearing stress is applied to the piezoelectric polymer, and it can be used as a sensor to detect application of stress to the piezoelectric structure, size of the stress, and the location to which it is applied.

With a piezoelectric structure in which knots are formed it is possible to extract a larger electrical signal than with a piezoelectric element comprising a conventional covered fiber without formation of knots, thus allowing the piezoelectric structure to be utilized to produce a sensor with improved sensing performance. In addition, since forming a knot such as a decorative knot can increase the aesthetic quality (design property) as a piezoelectric structure, it allows wider application in technical fields that require high design properties.

(Techniques for Applying Piezoelectric Structure)

Figure 5:
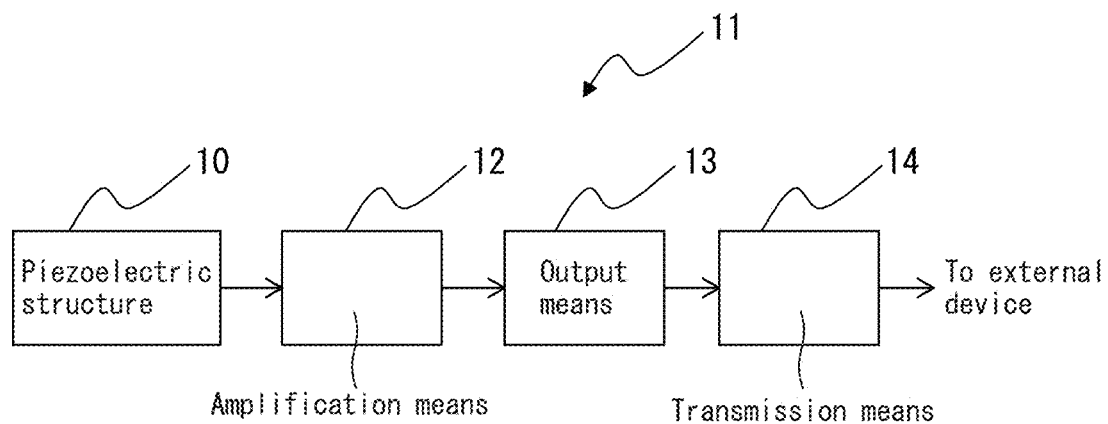
FIG. 5 is a block diagram showing a sensor comprising a piezoelectric structure according to the invention.

Since the piezoelectric structure of the invention in any desired form can output contact, pressure, shape deformation and vibration on the surface as an electrical signal, it can be utilized as a sensor that detects the size of stress and/or the location of stress applied to the piezoelectric structure. FIG. 5 is a block diagram showing a sensor comprising a piezoelectric structure according to the invention. By constructing a piezoelectric sensor 11 comprising a piezoelectric structure 10 of the invention, amplification means 12 that amplifies the electrical signal outputted from the piezoelectric structure 10 in response to applied pressure, output means 13 that outputs the electrical signal amplified by the amplification means 12, and transmission means 14 that transmits the electrical signal outputted from the output means 13 to an external device (not shown), it is possible to detect the size and/or applied location of stress applied to the piezoelectric structure 10, by computation processing at the external device (not shown), based on the electrical signal outputted by contact, pressure, shape deformation or vibration on the surface of the piezoelectric structure 10. Alternatively, computing means (not shown) may be provided in the piezoelectric sensor 11, that computes the size and/or applied location of stress applied to the piezoelectric structure 10, based on the electrical signal outputted from the output means 13.

The amplification means 12 may be constructed of different electronic circuits, for example, or it may be constructed as a functional module implemented by a software program that operates on a processor, or it may be constructed of a combination of different electronic circuits and a software program. Examples of processors include a CPU (Central Processing Unit), DSP (Digital Signal Processor), LSI (Large Scale Integration), ASIC (Application Specific Integrated Circuit) and FPGA (Field-Programming Gate Array). The output means 13 may also be constructed solely of different connectors, for example, or it may be constructed as a communication device integrated with the transmission means 14. Alternatively, the functions of the amplification means 12, output means 13 and transmission means 14 may be combined in the form of an integrated circuit or microprocessor in which a software program is written. Incidentally, the transmission system using transmission means 14 may be either wireless or wired, determined as appropriate depending on the sensor to be constructed. In addition, a contact probe may be implemented having the same construction as the sensor described above.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric structure 10 may be subjected to signal processing after being directly transmitted to an external device. Alternatively, instead of the signal strength being the current value or voltage value, their differential values or other computed values may be used as the size of the electrical signal outputted from the piezoelectric structure 10. The differential value, for example, allows drastic changes in the electrical signal to be precisely obtained, or the integral value allows analysis based on the size of deformation.

Figure 6:
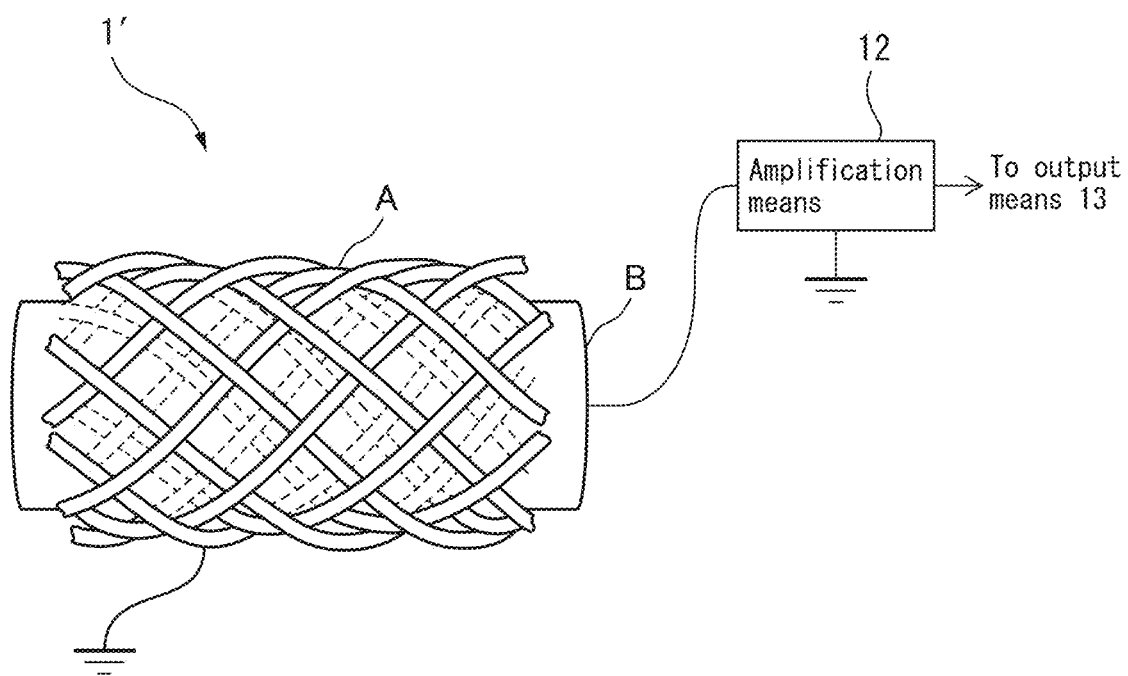
FIG. 6 is a schematic diagram showing an example of connecting a covered fiber and amplification means, in a sensor comprising a piezoelectric structure of the invention.

FIG. 6 is a schematic diagram showing an example of connecting a covered fiber, more specifically a braided covered fiber, and amplification means, in a sensor comprising a piezoelectric structure of the invention. The amplification means 12 of FIG. 6 corresponds to the one explained with reference to FIG. 5, although the illustration in FIG. 6 omits the output means 13 and transmission means 14 shown in FIG. 5. When a sensor comprising a piezoelectric structure 10 is to be constructed, for example, a lead wire is connected to the input terminal of the amplification means 12 from the conductive fiber B of the braided covered fiber 1' of the piezoelectric structure 10, and the piezoelectric fibers A are connected to a ground (earth) terminal.

INDUSTRIAL APPLICABILITY

The piezoelectric structure of the invention is flexible with an aesthetic quality, and it therefore has a very wide range of potential applications. Specific examples for devices comprising the piezoelectric structure of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may also be used as a surface pressure-sensitive sensor or shape deformation sensor in bedding materials such as sheets and pillows, shoe soles, gloves, chairs, mats, bags, flags and decorative accessories (such as necklaces, bracelets and earrings).

If it is in the form of an accessory that is to be in constant close contact with the wrist, for example, such as in the form of a misanga, it can constantly sense the pulse without the wearer being aware of it, or if it is in the form of a choker kept in constant close contact with the skin around the neck, it can sense and distinguish the pulse, throat movements while drinking or throat movements while coughing, based on signal strength, without any particular awareness by the wearer.

In addition, since the device of the invention is in braided or fabric form and is flexible, it may be used as a surface pressure-sensitive sensor or shape deformation sensor with an aesthetic quality, by attachment or covering on the surface of all or portions of various structures.

EXAMPLES

The present invention will now be described in greater detail by examples, with the understanding that the invention is not in any way restricted by the examples.

In the following Examples, the braided covered fiber 1-2 described below was used as the covered fiber of the invention, and it was produced by the following method.

The properties of the piezoelectric fibers used in the braided covered fiber were determined by the following method.

(1) Poly-L-lactic acid crystallinity $X_{homo}$:

The poly-L-lactic acid crystallinity $X_{homo}$ was determined from crystal structure analysis by wide-angle X-ray diffraction (WAXD). In the wide-angle X-ray diffraction (WAXD), an Ultrax18 X-ray diffraction apparatus by Rigaku Corp. was used in a transmission method, and the X-ray diffraction pattern of a sample was recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers aligned to form a 3 cm fiber bundle.

The total scattering intensity $I_{total}$ over the declination in the obtained X-ray diffraction pattern was determined, and the sum $\Sigma I_{HMi}$ of the integrated intensity for each diffraction peak attributed to poly-L-lactic acid crystals, appearing near 2θ=16.5°, 18.5° and 24.3°, was calculated. Based on these values, the poly-L-lactic acid crystallinity $X_{homo}$ was calculated by the following formula (3).

[Mathematical Formula 3]

$$\text{Poly-}L\text{-lactic acid crystallinity } X_{homo}(\%) = \Sigma I_{HMi}/\text{total} \times 100 \quad (3)$$

The value of $\Sigma I_{HMi}$ was calculated by subtracting the background and amorphous diffuse scattering from the total scattering intensity.

(2) Poly-L-Lactic Acid Crystal Orientation A:

In the X-ray diffraction pattern obtained by the aforementioned wide-angle X-ray diffraction (WAXD), the poly-L-lactic acid crystal orientation A had an intensity distribution with respect to the declination (°) for the diffraction peaks attributable to poly-L-lactic acid crystals, appearing near 2θ=16.5° in the radius vector direction, and it was calculated from the sum $\Sigma W_i$ (°) of the half-widths in the obtained distribution profile, using the following formula (4).

[Mathematical Formula 4]

$$\text{Poly-L-lactic acid crystal orientation } A\ (\%) = (360 - \Sigma W_i) \div 360 \times 100 \quad (4)$$

(3) Optical Purity of Polylactic Acid:

After sampling 0.1 g of a single polylactic acid fiber composing the braided covered fiber (one bundle in the case of a multifilament), 1.0 mL aqueous sodium hydroxide at 5 mol/liter concentration and 1.0 mL methanol were added, the mixture was set in a water bath shaker adjusted to 65° C. hydrolysis was performed for about 30 minutes until the polylactic acid became a homogeneous solution, the completely hydrolyzed solution was neutralized to pH 7 by addition of 0.25 mol/liter sulfuric acid, and 0.1 mL of the hydrolyzed solution was sampled and diluted with 3 mL of a high-performance liquid chromatography (HPLC) mobile phase solution, and filtered with a membrane filter (0.45 μm). The modified solution was measured by HPLC to quantify the proportion of L-lactic acid monomer and D-lactic acid monomer. When one polylactic acid fiber did not fully supply 0.1 g, the amount of the other solution was adjusted to match the sampleable amount, and the polylactic acid concentration of the sample solution provided for HPLC measurement was adjusted in a range from an amount equal to the above, to 1/100.

<HPLC Measuring Conditions>

Column: "SUMICHIRALR" OA-5000 (4.6 mmφ×150 mm) by Sumika Chemical Analysis Service, Ltd.

Mobile phase: 1.0 millimole/liter aqueous copper sulfate solution

Mobile phase flow rate: 1.0 milliliter/min

Detector: UV detector (wavelength of 254 nm)

Injection rate: 100 microliters

With the peak area attributed to L-lactic acid monomer as $S_{LLA}$ and the peak area attributed to D-lactic acid monomer as $S_{DLA}$, since $S_{LLA}$ and $S_{DLA}$ are proportional to the molar concentration of L-lactic acid monomer $M_{LLA}$ and the molar concentration $M_{DLA}$ of D-lactic acid monomer, respectively, the larger value of $S_{LLA}$ and $S_{DLA}$ was used as $S_{MLA}$ to calculate the optical purity by the following formula (5).

[Mathematical Formula 5]

$$\text{Optical purity (\%)} = S_{MLA} \div (S_{LLA} + S_{DLA}) \times 100 \quad (5)$$

(Production of Polylactic Acid)

The polylactic acid was produced by the following method.

After adding 0.005 part by mass of tin octylate to 100 parts by mass of L-lactide (product of Musashino Chemical Laboratory. Co. Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

PLLA1 melted at 240° C. was discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread PF1. PLLA1 melted at 240° C. was discharged from a 12-hole cap at 8 g/min, and drawn out at 1050 m/min. The unstretched multifilament thread was stretched to a factor of 2.3 at 80° C. and heat set at 150° C. to obtain an 33 dtex/12 filament multifilament uniaxial stretched thread PF2. The piezoelectric fibers PF1 and PF2 were used as piezoelectric polymers. The poly-L-lactic acid crystallinity, poly-L-lactic acid crystal orientation and optical purity of PF1 and PF2 were measured by the methods described above, giving the results listed in Table 1.

TABLE 1

| Piezoelectric fibers | Poly-L-lactic acid crystallinity $X_{homo}$ [%] | Poly-L-lactic acid crystal orientation A [%] | Polylactic acid optical purity [%] |
|---|---|---|---|
| PF1 | 35.9 | 95.6 | 99.7 |
| PF2 | 36.8 | 94.8 | 99.9 |

(Conductive Fiber)

Silver plated nylon "AGposs" 100d34f (CF1) by Mitsufuji Corp. was used as the conductive fiber B. The resistivity of the CF1 was 250 Ω/m.

Silver plated nylon "AGposs" 30d10f (CF2) by Mitsufuji Corp. was used as the conductive fiber B. The conductivity of the CF2 was 950 Ω/m.

(Insulating Fibers)

Stretched yarn IF1 (84 dTex/24 filament) produced by melt spinning and then stretching of polyethylene terephthalate, and stretched yarn IF2 (33 dTex/12 filament), were used as insulating fibers.

(Braided Covered Fiber)

A braided covered fiber 1-1 was fabricated having conductive fiber CF1 as the core thread and with piezoelectric fibers PF1 wound in a helical manner in the Z-twisting direction around the core thread, as shown in FIG. 3, by setting the piezoelectric fibers PF1 on 4 carriers in the Z-twisting direction and setting insulating fibers IF1 on 4 carriers in the S-twisting direction, of the 8 carriers of an 8-strand round braid braiding machine. The coiling angle (orientation angle θ) of the piezoelectric fibers was 45° with respect to the fiber axis CL of the conductive fiber. Using the braided covered fiber 1-1 as core thread, braided covered fiber 1-2 (diameter: ~0.4 mm), having the periphery of the braided covered fiber 1-1 covered by conductive fibers, was fabricated by setting the conductive fibers CF2 on all of the 4 carriers in the Z-twisting direction and 4 carriers in the S-twisting direction, of the 8 carriers of the braider.

Example 1

Figure 7A:
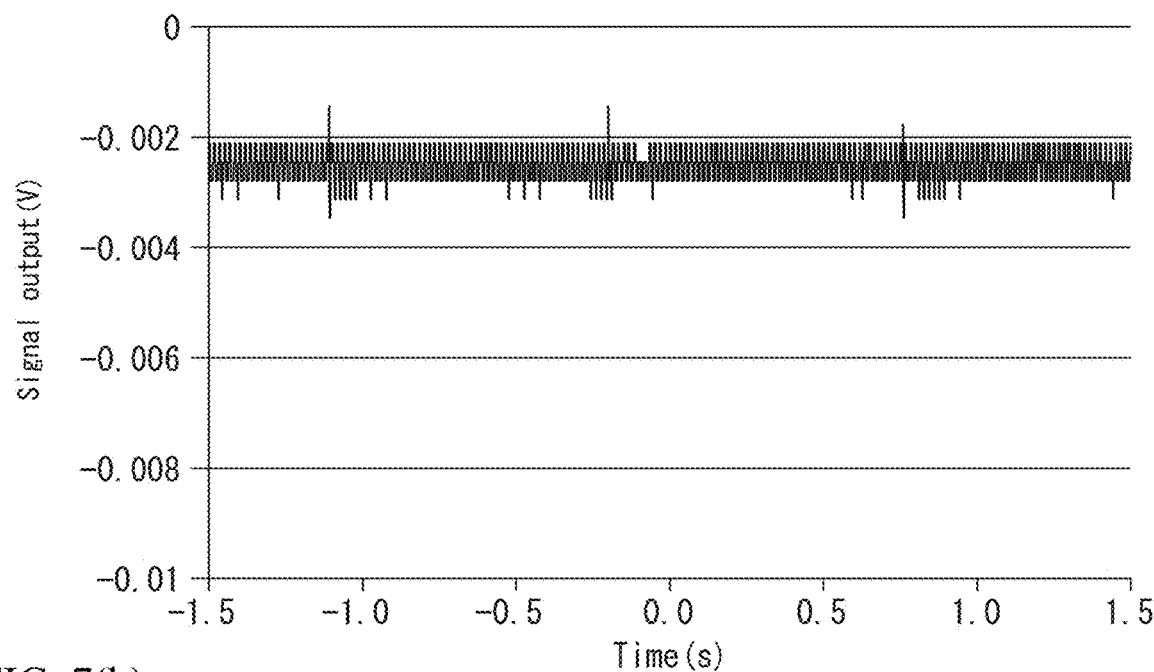
FIG. 7(a) is a graph showing an example of an electrical signal outputted from a braided covered fiber without a knot.
Figure 7B:
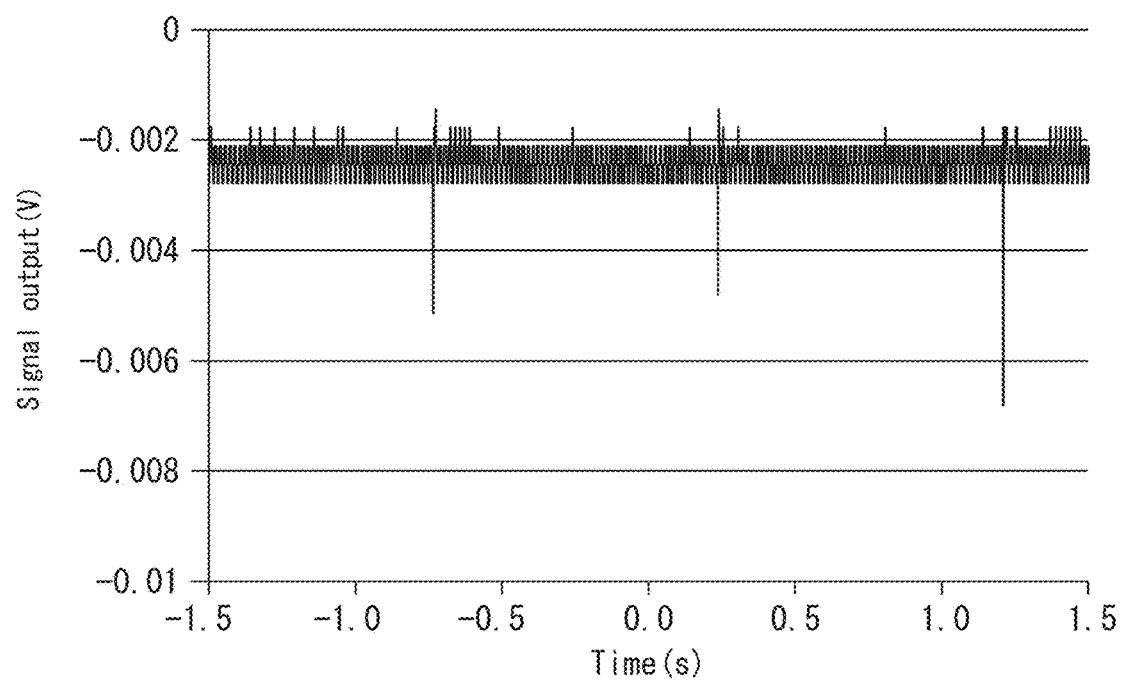
FIG. 7(b) is a graph showing an example of an electrical signal outputted from a piezoelectric structure with a knot.

The signal strength for the braided covered fiber 1-2 provided with a knot was examined. For the test, first the piezoelectric structure provided with a half hitch knot was set on a horizontal surface, and then a hard sheet was placed on the piezoelectric structure for even distribution of stress, and the hard sheet was tapped several times from above with the hand. The results are shown in FIG. 7(b). FIG. 7(a) is a graph showing results for the same test on braided covered fiber 1-2, which did not have knots.

From FIG. 7(b) it can be seen that an electrical signal outputted from the piezoelectric structure was detected that corresponded to the movement of tapping the piezoelectric structure with the hand, at approximately 1 second intervals. When the same experiment was conducted for the braided covered fiber 1-2 that did not have knots, there was no noticeable fluctuation in the electrical signal outputted from the braided covered fiber 1-2, as is clear from the results in FIG. 7(a).

Example 2

Figure 8:
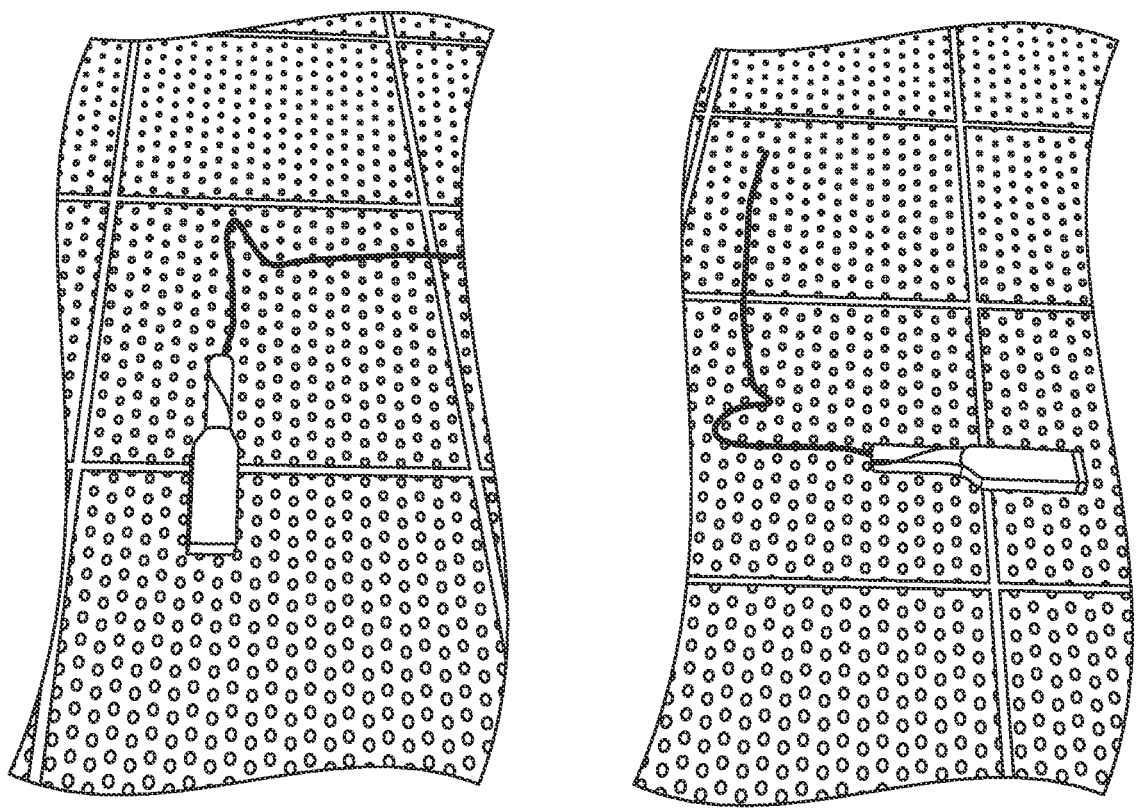
FIGS. 8(a) and 8(b) are photographs showing piezoelectric structures without a knot, according to the invention.
FIG. 8(c) is a graph showing an electrical signal outputted from the piezoelectric structure in response to multiple different movements.
Figure 8:
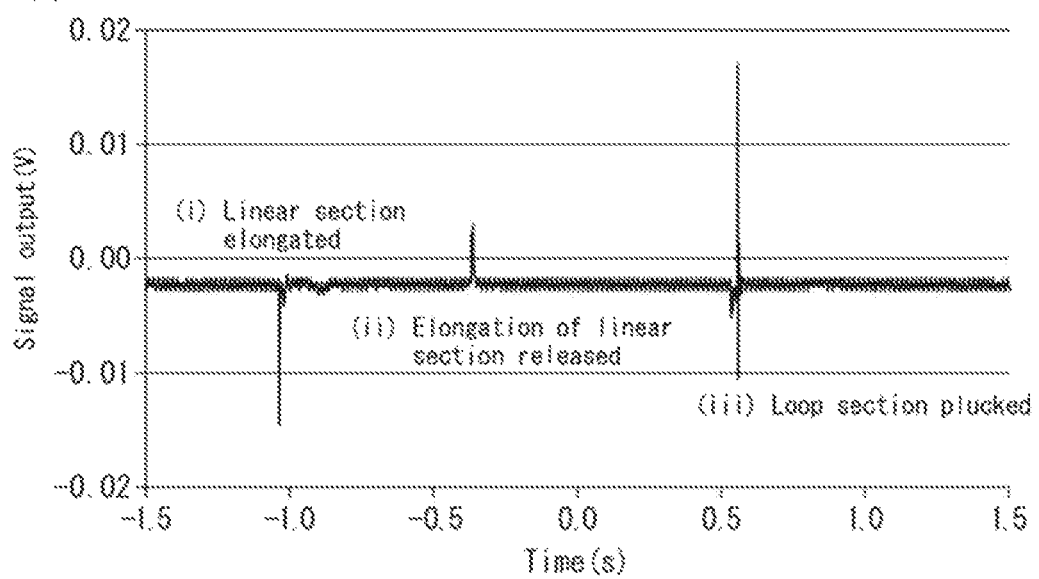

For this example, the braided covered fiber 1-2 was used to produce a piezoelectric structure without knots, as shown in FIGS. 8(a) and (b), and the electrical signal obtained from the piezoelectric structure was examined. The results are shown in FIG. 8(c). The piezoelectric structure was produced by forming a bent section (loop section) in the braided covered fiber 1-2, and then fixing the bent section with the rapid bonding adhesive "AronAlpha EXTRA2000" (product of ToaGosei Co., Ltd.).

FIGS. 8(a) and (b) are photographs showing piezoelectric structures without knots according to the invention, and FIG. 8(c) is a graph showing an electrical signal outputted from the piezoelectric structure in response to multiple different movements. As shown in FIG. 8(c), a notable signal output could be detected (i) when the linear section of the piezoelectric structure was elongated, (ii) when elongation of the linear section of the piezoelectric structure was released and (iii) when the loop section of the piezoelectric structure was plucked. This result may be said to suggest that the piezoelectric structure of the invention can output an electrical signal not only in response to specific stress or stress from specific directions, but in response to a variety of different types of stress.

Example 3

Figure 9:
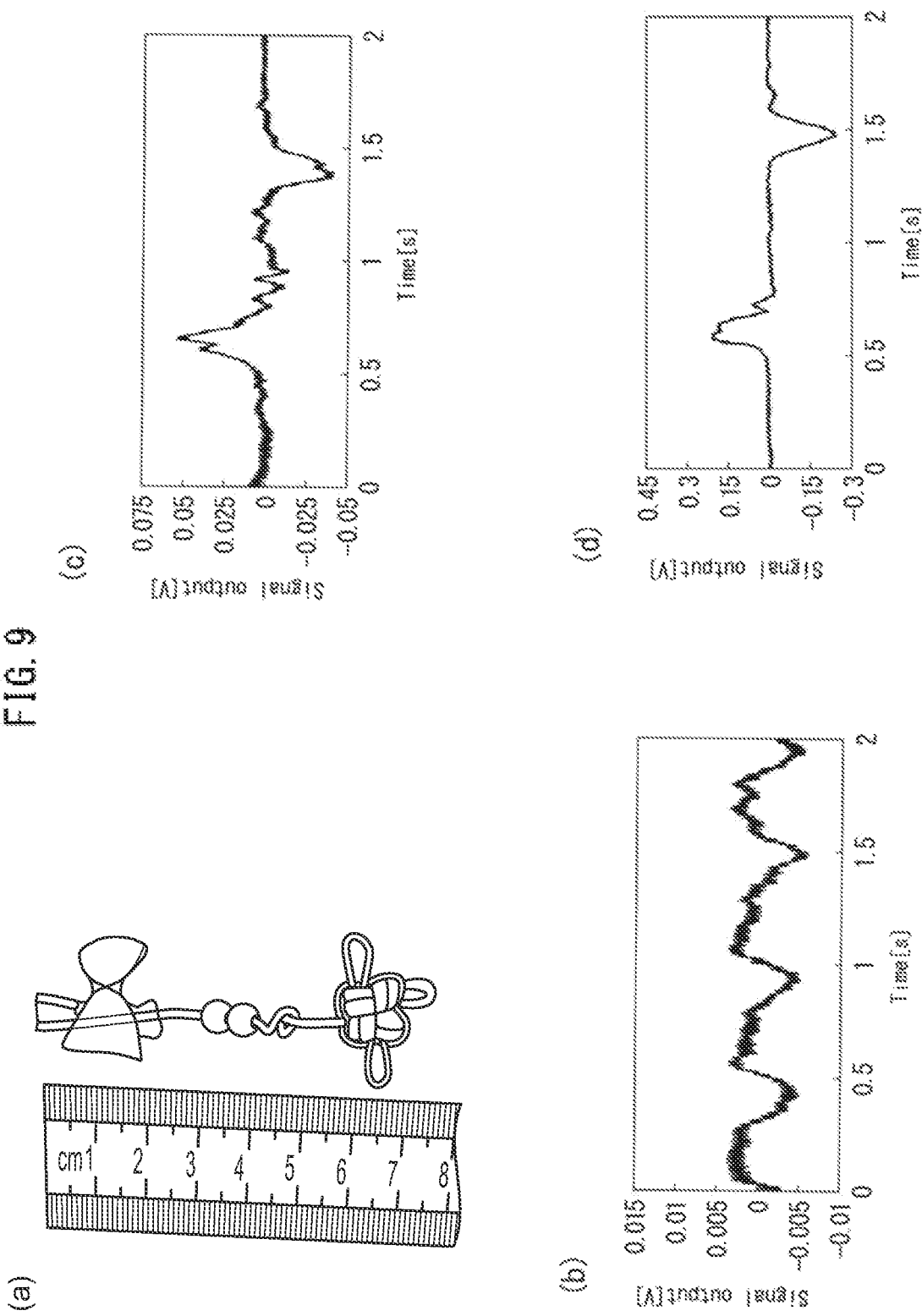
FIG. 9(a) is a photograph showing a piezoelectric structure that includes a combination of a kissho knot and a tsuyu knot.
FIGS. 9(b) to 9(d) are graphs showing electrical signals outputted from the piezoelectric structure in response to movements of "swinging", "finger pinching" and "pulling", respectively.

For this example, the braided covered fiber 1-2 was inserted in a braid with a diameter of 1 mm composed of insulating fibers, and was used to produce a piezoelectric structure containing a combination of a kissho knot and a tsuyu knot, as shown in FIG. 9(a), and the electrical signals outputted from the piezoelectric structure for multiple different movements were examined. The results are shown in FIG. 9(b)-(d).

FIG. 9(a) is a photograph showing a piezoelectric structure that includes a combination of a kissho knot and a tsuyu knot, and FIG. 9(b) to (d) are graphs showing electrical signals outputted from the piezoelectric structure in response to movements of "swinging", "finger pinching" and "pulling", respectively. As clearly seen from the results in FIG. 9(b) to (d), the behavior of completely different electrical signals could be detected for these movements, and therefore the movements could be clearly distinguished.

Example 4

Figure 10B:
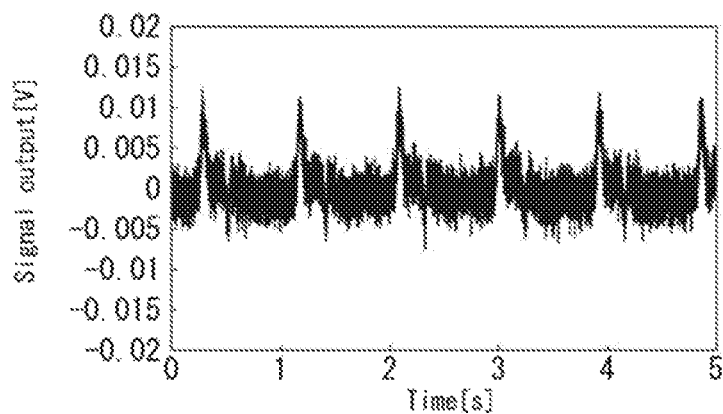
FIGS. 10(b) to 10(d) are graphs showing electrical signals outputted from the choker in response to movements of "neck pulse", "beverage drinking" and "coughing", respectively.

For this example, the braided covered fiber 1-2 was inserted in a braid with a diameter of 1 mm composed of insulating fibers, and was used to produce a choker by a piezoelectric structure containing a combination of a kissho knot and a tsuyu knot, as shown in FIG. 10(a), and the electrical signals outputted from the choker for multiple different movements were examined, when it was wrapped around the neck of a human. The results are shown in FIG. 10(b)-(d).

Figure 10C:
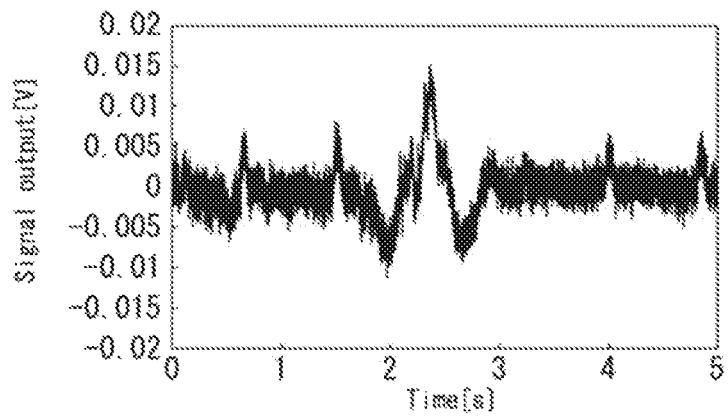
Figure 10D:
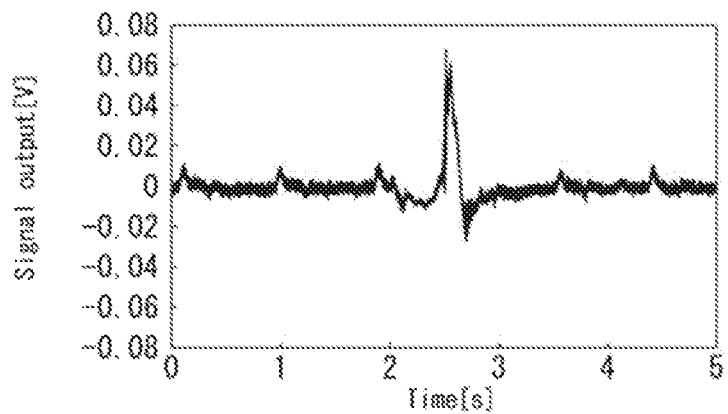

FIG. 10(a) is a photograph showing a choker as a piezoelectric structure that includes a combination of a kissho knot and a tsuyu knot, and FIG. 10(b) to (d) are graphs showing electrical signals outputted from the choker in response to movements of "neck pulse", "beverage drinking" and "coughing", respectively. As clearly seen from the results of FIG. 10(b) to (d), it was possible to detect the slight movement of a pulse as an electrical signal, while it was also possible to detect behavior of completely different electrical signals in response to these movements, allowing the movements to be clearly distinguished.

Example 5

Figure 11:
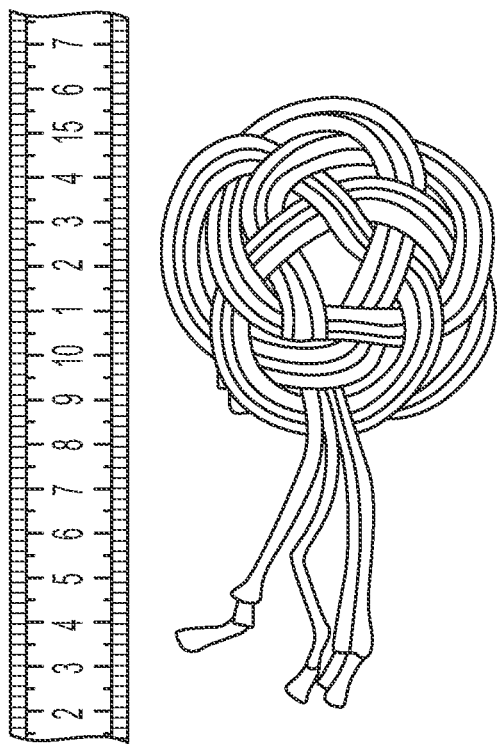
FIG. 11 is a photograph showing a coaster as a piezoelectric structure including a 15-angled star knot.

For this example, the braided covered fiber 1-2 was inserted into 3 braids, blue, yellow and white, with diameters of 3 mm and composed of insulating fibers, which was used to produce a coaster as a piezoelectric structure containing a 15-angled star knot, as shown in FIG. 11, and the electrical signals outputted from the coaster for multiple different movements were examined. The results are shown in FIGS. 12(a) to 12(c).

Figures 12A, 12B, 12C:
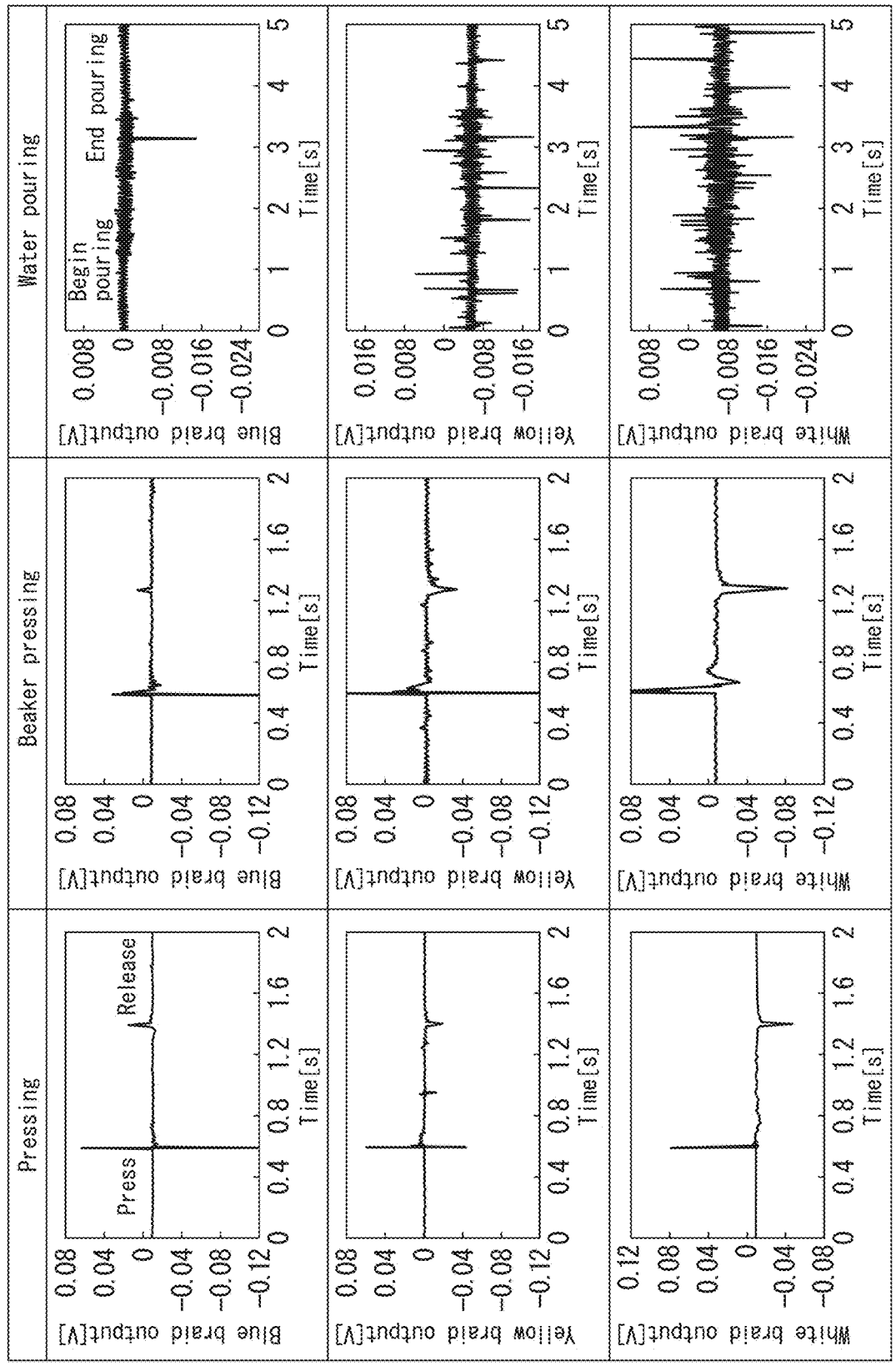
FIGS. 12(a) to 12(c) are graphs showing electrical signals outputted from the coaster as a piezoelectric structure including a 15-angled star knot, in response to movements of "finger pressing", "beaker pressing" and "pouring water into beaker", respectively.

FIG. 12(a) to (c) are graphs showing electrical signals outputted from the coaster as a piezoelectric structure including a 15-angled star knot, in response to movements of "finger pressing", "beaker pressing" and "pouring water into beaker", respectively. In FIG. 12(a) to (c), the electrical signals outputted from the three braided covered fibers of blue, yellow and white are shown, in order from the top. For the movements of "finger pressing" and "beaker pressing", different waveforms are observed when pressing and releasing, allowing these movements to be distinguished. For the movement of "beaker pressing", the forms of the electrical signals outputted for the three braided covered fibers, blue, yellow and white, were each slightly different. This is believed to be due to the different constrained locations of the three braided covered fibers in the coaster, and may suggest that objects placed on the coaster and their manner of placement can be discriminated. In addition, differences were clearly detected in the behaviors of the electrical signals between the movements of "finger pressing" and "beaker pressing" and the movement of "pouring water into beaker", allowing these movements to also be clearly distinguished from each other.

Example 6

Figure 13:
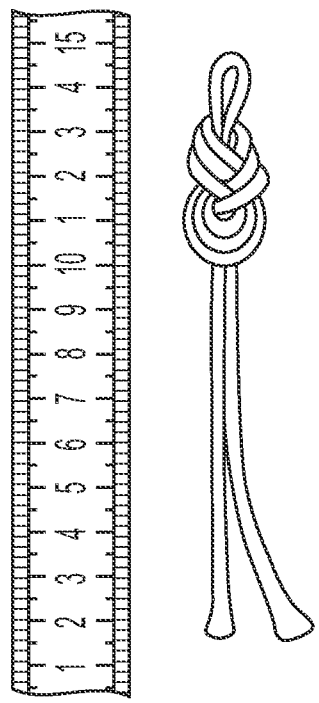
FIG. 13 is a photograph showing a piezoelectric structure including a myoga knot.

For this example, the braided covered fiber 1-2 was inserted in a braid with a diameter of 3 mm composed of insulating fibers, and was used to produce a piezoelectric structure containing a myoga knot, as shown in FIG. 13, and the electrical signals outputted from the piezoelectric structure for multiple different movements were examined. The results are shown in FIGS. 14(a) to 14(c).

Figures 14A, 14B, 14C:
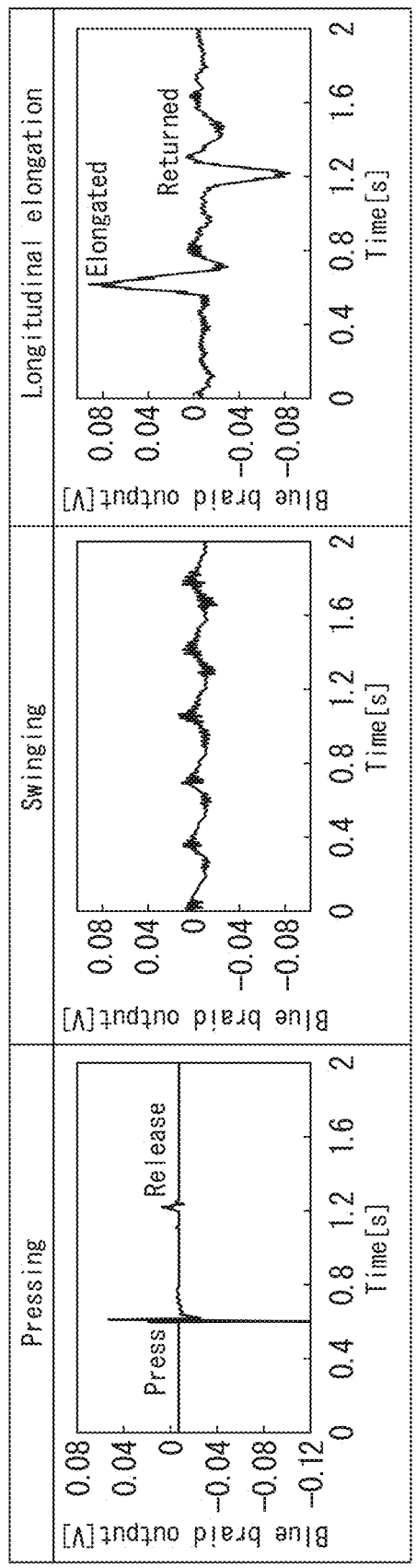
FIGS. 14(a) to 14(c) are graphs showing electrical signals outputted from a piezoelectric structure including a myoga knot, in response to movements of "finger pressing", "swinging" and "longitudinal elongation", respectively.

FIG. 14(a) to (c) are graphs showing electrical signals outputted from a piezoelectric structure including a myoga knot, in response to movements of "finger pressing", "swinging" and "longitudinal elongation", respectively. Referring to FIG. 14(a), for example, a different waveform is observed when the piezoelectric structure is pressed with a finger than when it is released, allowing these two movements to be distinguished. Similarly, referring to FIG. 14(c), a different waveform is observed when the piezoelectric structure is elongated longitudinally than when it is returned, allowing these two movements to be distinguished. Furthermore, as clearly seen from the results in FIGS. 14(a) to (c), the behavior of completely different electrical signals could be detected for the movements of "finger pressing", "swinging" and "longitudinal elongation", thus allowing these movements to be clearly distinguished.

Example 7

Figure 15:
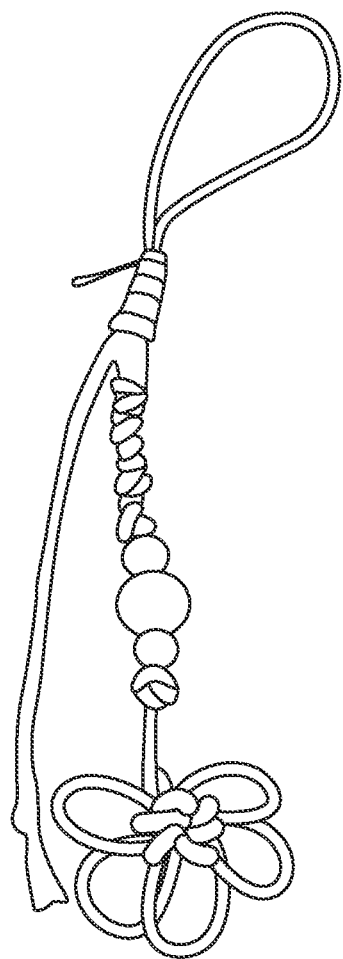
FIG. 15 is a photograph showing a key ring as a piezoelectric structure including a chrysanthemum knot.

For this example, the braided covered fiber 1-2 was inserted in a braid with a diameter of 3 mm composed of insulating fibers, and when this was used to produce a piezoelectric structure including a chrysanthemum knot as shown in FIG. 15 and the electrical signals outputted from the piezoelectric structure in response to multiple different movements were examined, it was possible to detect the behavior of completely different electrical signals in response to movements of "finger pressing", "swinging" and "longitudinal elongation", and thus to clearly distinguish these movements, similar to the cases of the other knots.

Example 8

For this example, the effect of the orientation angle θ and T1/T2 value of piezoelectric polymers on electrical signals in response to elongation deformation was examined, for a covered fiber used in a piezoelectric structure of the invention.

The properties of the covered fiber were determined by the following method.

(1) Orientation angle θ of piezoelectric polymer with respect to direction of central axis The orientation angle θ of the piezoelectric polymer with respect to the direction of the central axis was calculated by the following formula.

$$\theta = \arctan(2\pi Rm/HP)(0° \leq \theta \leq 90°)$$

Here, $Rm = 2(Ro^3 - Ri^3)/3(Ro^2 - Ri^2)$, i.e., the radius of the braided covered fiber (or other structure) as the weighted average based on the cross-sectional area. The helical pitch HP and the outer radius Ro and inner radius Ri of the portions constituted by the braided covered fiber (or other structure) were measured in the following manner.

Figure 16A:
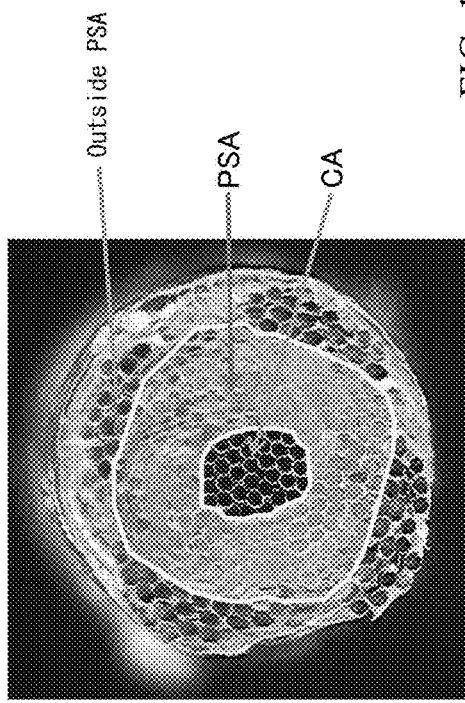
FIGS. 16(a) to 16(c) are a set of cross-sectional photographs of a braided covered fiber according to an embodiment.
Figure 16B:
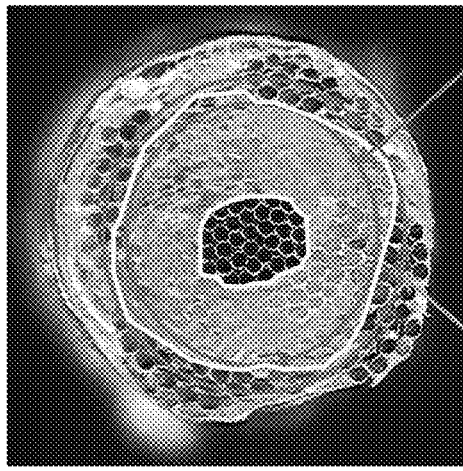
Figure 16C:
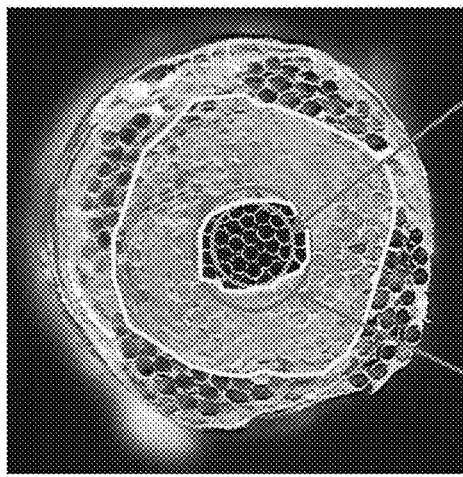

(1-1) For a braided covered fiber, the side was photographed (or in the case of covering other than by the piezoelectric polymer of the braided covered fiber, the covering was first removed as necessary to form a condition allowing the piezoelectric polymer to be observed from the side), and the helical pitch HP (μm) of the piezoelectric polymer was measured at 5 arbitrary locations as shown in FIG. 4, recording the average value. The braided covered fiber was impregnated with the low-viscosity rapid bonding adhesive "AronAlpha EXTRA2000" (ToaGosei Co., Ltd.) which was allowed to solidify, after which a cross-section was cut out perpendicular to the long axis of the braid, a cross-sectional photograph was taken, and for each cross-sectional photograph, the outer radius Ro (μm) and inner radius Ri (μm) were measured at sections occupied by the braided covered fiber, with the same measurement being conducted at 5 other arbitrary cross-section locations and the average value being recorded. When a piezoelectric polymer and insulating polymer were both incorporated, such as when using doubled piezoelectric fibers and insulating fibers, or when 4 fibers of an 8-strand braid were of the piezoelectric polymer and the remaining 4 fibers were of the insulating polymer, since the regions where the piezoelectric polymer was present and the regions where the insulating polymer was present were interchanging when taking cross-sections at different locations, the regions where the piezoelectric polymer was present and the regions where the insulating polymer was present were collectively considered to be the portion occupied by the braided covered fiber. However, sections where the insulating polymer and piezoelectric polymer were not both incorporated were not considered to be part of the braided covered fiber. The outer radius Ro and inner radius Ri were measured in the following manner. As shown in the cross-sectional photograph of FIG. 16(a), two regions were defined: the region occupied by the sheath 2 formed by piezoelectric fibers A (this region will hereunder be referred to as "PSA"), and the region at the center portion of PSA that was not PSA (this region will hereunder be referred to as "CA"). The average value between the diameter of the minimum circle not overlapping with PSA, on the outside of PSA, and the diameter of the maximum circle not falling outside of PSA (but possibly falling within CA) was recorded as Ro (FIG. 16(b)). Also, the average value between the diameter of the minimum circle not overlapping with CA, on the outside of CA, and the diameter of the maximum circle not falling outside of CA was recorded as Ri (FIG. 16(c)).

(1-2) For a covering thread-like covered fiber, the helical pitch HP (μm) was 1,000,000/T, for a winding speed of T times/m during covering of the piezoelectric polymer (the rotational speed of the piezoelectric polymer per length of the covering thread). The covering thread-like covered fiber was impregnated with the low-viscosity rapid bonding adhesive "AronAlpha EXTRA2000" (ToaGosei Co., Ltd.) which was allowed to solidify, after which a cross-section was cut out perpendicular to the long axis of the braid, a cross-sectional photograph was taken, and for each cross-sectional photograph, the outer radius Ro (μm) and inner radius Ri (μm) were measured at sections occupied by the covering thread-like covered fiber, similar to the braided covered fiber, with the same measurement being conducted at 5 other arbitrary locations of the cross-section and the average value being recorded. When a piezoelectric polymer and insulating polymer were both covered, such as when doubled piezoelectric fibers and insulating fibers were covered, or when piezoelectric fibers and insulating fibers were simultaneously covered in a non-overlapping manner, since the regions where the piezoelectric polymer was present and the regions where the insulating polymer was present were interchanging when taking cross-sections at different locations, the regions where the piezoelectric polymer was present and the regions where the insulating polymer was present were collectively considered to be the portion occupied by the covering thread-like covered fiber. However, sections where the insulating polymer and piezoelectric polymer were not simultaneously covered, i.e., sections in which the insulating polymer was always on the inside or outside of the piezoelectric polymer in any cross-section, were not considered to be part of the covering thread-like covered fiber.

(2) Electrical Signal Measurement

With an Electrometer (B2987A by Keysight Technologies Inc.) connected to the conductor of the covered fiber via a coaxial cable (core: Hi electrode, shield: Lo electrode), the covered fiber was subjected to one of the motion tests of 2-1 to 2-5 below, while measuring the current value at 50 msec intervals.

(2-1) Tensile Test

Using a "TENSILON RTC-1225A" universal testing machine by Orientech Co., Ltd., the covered fiber was gripped by a chuck across a spacing of 12 cm in the longitudinal direction of the covered fiber, and with 0.0 N as the force on the covered fiber in the relaxed state and 0 mm as the displacement when stretching to a tensile force of 0.5 N, an operation of pulling to 1.2 mm at an operating speed of 100 mm/min followed by restoration to 0 mm at an operating speed of −100 mm/min, was repeated 10 times.

(2-2) Torsional Test

Using a torsional test device designed having one of two chucks gripping the covered fiber set on a rail able to move freely in the long axis direction of the covered fiber without twisting movement, with constant application of 0.5 N tensile force on the covered fiber, and the other chuck able to perform twisting movement without movement in the long axis direction of the covered fiber, the covered fiber was gripped with the chucks across a spacing of 72 mm in the longitudinal direction of the covered fiber, and a reciprocal twisting operation of rotating from 0° to 45° at a speed of 100°/s followed by rotating from 45° to 0° at a speed of −100°/s was repeated 10 times, the twisting being in the clockwise direction when viewing the chucks from the center of the covered fiber.

(2-3) Bending Test

Using a test apparatus comprising two chucks, an upper and a lower chuck, with the lower chuck fixed and the upper chuck positioned 72 mm above the lower chuck, the upper chuck being movable over an imaginary circumference having a line segment connecting the two chucks as the diameter, the covered fiber was anchored by being gripped by the chucks, and after slightly warping the covered fiber in a convex manner in the 9-o'clock direction with the upper chuck at the 12-o'clock position and the lower chuck at the 6-o'clock position on the circumference, reciprocal bending motion in which the upper chuck was moved from the 12-o'clock position through the 1-o'clock and 2-o'clock positions on the circumference to the 3-o'clock position over a period of 0.9 second at a constant speed, and then moved to the 12-o'clock position over a period of 0.9 second, was repeated 10 times.

(2-4) Shearing Test

A section of the covered fiber with a length of 64 mm at the center portion was horizontally sandwiched from above and below by two rigid metal sheets having a plain woven fabric that was woven with cotton yarn at a yarn count of 50 attached to their surfaces (the lower metal sheet being fixed to a base), and a perpendicular load of 3.2 N was applied from above with the cotton cloth and covered fiber unable to slide between the metal sheet surfaces, after which shearing motion, in which the upper metal sheet was pulled in the longitudinal direction of the covered fiber over a period of 1 second from a load of 0 N to 1 N and then the tensile load was restored to 0 N over a period of 1 second, was repeated 10 times.

(2-5) Compression Test

Using a "TENSILON RTC-1225A" universal testing machine by Orientech Co., Ltd., a section of the covered fiber with a length of 64 mm at the center portion, set still on a horizontal rigid metal base, was gripped horizontally by the rigid metal sheet set on the upper cross head, and motion in which the upper cross head was lowered and pressed on the metal sheet from above the covered fiber from a reaction force of 0.01 N to 20 N over a period of 0.6 second and then the pressure was released to 0.01 N over a period of 0.6 second, was repeated 10 times.

Example A

As the sample for Example A, a braided covered fiber 1-A was fabricated having conductive fiber CF1 as the core thread and with piezoelectric fibers PF1 wound in a helical manner in the Z-twisting direction around the core thread, as shown in FIG. 3, by setting the piezoelectric fibers PF1 on 4 carriers in the Z-twisting direction and setting insulating fibers IF on 4 carriers in the S-twisting direction, of the 8 carriers of an 8-strand round braid braiding machine.

Example B

Using the braided covered fiber 1-A as core thread, braided covered fiber 1-B, having the periphery of the braided covered fiber 1-A covered by conductive fibers, was fabricated by setting the conductive fibers CF2 on all of the 4 carriers in the Z-twisting direction and 4 carriers in the S-twisting direction, of the 8 carriers of the braider.

Examples C and D

In the same manner as braided covered fiber 1-A, except for changing the coiling speed for PF1, two braided covered fibers were formed and the braided covered fibers were used as core threads and covered with conductive fibers in the same manner as braided covered fiber 1-B, to fabricate braided covered fibers 1-C and 1-D.

Examples E to H

Braided covered fibers were fabricated having piezoelectric fibers PF1 wound in a helical fashion at prescribed proportions in the Z-twisting direction and the S-twisting direction around the core thread, by setting PF 1 or IF 1 on carriers in the Z-twisting direction and S-twisting direction of the 8 carriers of the braider as shown in Table 2, and braided covered fibers 1-E to 1-H were fabricated having the braided covered fibers as core threads and covered with conductive fibers in the same manner as braided covered fiber 1-B.

Example I

A braided covered fiber was fabricated in the same manner as braided covered fiber 1-A, except for using PF2 instead of PF1 and IF2 instead of IF1, and adjusting the coiling speed, and the braided covered fiber was used as core thread and covered with conductive fibers in the same manner as braided covered fiber 1-B, to fabricate braided covered fiber 1-I.

Example J

A braided covered fiber was fabricated in the same manner as braided covered fiber 1-A, except for using IF2 instead of PF2 and PF2 instead of IF2, and adjusting the coiling speed, and the braided covered fiber was used as core thread and covered with conductive fibers in the same manner as braided covered fiber 1-B, to fabricate braided covered fiber 1-J.

Example K

Covering thread-like covered fiber 1-K was fabricated having piezoelectric fibers PF1 wrapped in a helical manner around a core thread in the S-twisting direction and having the outside covered by conductive fibers, by using CF1 as the core thread and PF1 wrapped around to cover the core thread 3000 times/m in the S-twisting direction, further wrapping the outside with IF1 to cover it 3000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

Example L

A braided covered fiber was fabricated in the same manner as braided covered fiber 1-A, except for using IF1 instead of PF1 and adjusting the coiling speed, and the braided covered fiber was used as core thread and covered with conductive fibers in the same manner as braided covered fiber 1-B, to fabricate braided covered fiber 1-L.

Example M

A covering thread-like covered fiber was fabricated in the same manner as covering thread-like covered fiber 1-K, except for using IF1 instead of PF1, to obtain covering thread-like covered fiber 1-M.

Example N

Braided covered fiber 1-N was fabricated in the same manner as braided covered fiber 1-B, except for using PF1 instead of IF1.

Example O

Braided covered fiber 1-O was fabricated in the same manner as braided covered fiber 1-I, except for using PF2 instead of IF2.

Example P

A braided covered fiber was fabricated having conductive fiber CF1 as the core thread and piezoelectric fibers PF1 wrapped in a helical fashion around a core thread in the Z-twisting direction, by setting the piezoelectric fibers PF1 on 8 carriers in the Z-twisting direction and setting insulating fibers IF1 on 8 carriers in the S-twisting direction, of the 16 carriers of a 16-strand round braid braiding machine, and braided covered fiber 1-P was fabricated having this braided covered fiber as the core thread and covered with conductive fiber in the same manner as braided covered fiber 1-B.

Example Q

Covering thread-like covered fiber 1-Q was fabricated having piezoelectric fibers PF1 wrapped in a helical manner around a core thread in the S-twisting direction and having the outside further covered by conductive fibers, by using CF1 as the core thread and PF1 wrapped around to cover the core thread 6000 times/m in the S-twisting direction, further wrapping the outside with IF1 to cover it 6000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

The Ri. Ro and HP values of each covered fiber were measured, and the calculated values of the orientation angle θ of the piezoelectric polymer with respect to the direction of the central axis and the T1/T2 are shown in Table 2. Ri and Ro for each braided covered fiber were measured in a region occupied by the covered fiber which was a combination of cross-sectional regions containing piezoelectric fibers and insulating fibers. Ri and Ro for each covering thread-like covered fiber were also measured in a region occupied by the covered fiber, which was a cross-sectional region containing piezoelectric fibers. Each covered fiber was also cut to a 15 cm length and connected to an Electrometer (B2987A by Keysight Technologies Inc.) with conductive fiber of the core as the Hi electrode and conductive fibers of the wire mesh or sheath shielding the periphery as the Lo electrode, to monitor the current value. Table 2 shows the current values during the tensile test, torsional test, bending test, shearing test and compression test. Examples L and M did not include a piezoelectric polymer, and therefore the θ and T1/T2 values could not be measured.

TABLE 2

| Ex. | Element | Conductive fiber of core | Piezoelectric fibers Z-twisting direction | Piezoelectric fibers S-twisting direction | Θ [°] | T1/T2 |
|---|---|---|---|---|---|---|
| A | Braided piezoelectric element 1-A | CF1 | PF1 4 strands | IF1 4 strands | 38 | 0 |
| B | Braided piezoelectric element 1-B | CF1 | PF1 4 strands | IF1 4 strands | 38 | 0 |
| C | Braided piezoelectric element 1-C | CF1 | PF1 4 strands | IF1 4 strands | 44 | 0 |
| D | Braided piezoelectric element 1-D | CF1 | PF1 4 strands | IF1 4 strands | 29 | 0 |
| E | Braided piezoelectric element 1-E | CF1 | PF1 4 strands | PF1 1 strand IF1 3 strands | 44 | 0.25 |
| F | Braided piezoelectric element 1-F | CF1 | PF1 4 strands | PF1 2 strands IF1 2 strands | 43 | 0.5 |
| G | Braided piezoelectric element 1-G | CF1 | PF1 4 strands | PF1 3 strands 1F1 1 strand | 45 | 0.75 |
| H | Braided piezoelectric element 1-H | CF1 | PF1 1 strand IF1 3 strands | IF1 4 strands | 43 | 0 |
| I | Braided piezoelectric element 1-I | CF1 | PF2 4 strands | IF2 4 strands | 44 | 0 |
| J | Braided piezoelectric element 1-J | CF1 | IF2 4 strands | PF2 4 strands | 42 | 0 |
| K | Covering fiber-like piezoelectric element 1-K | CF1 | IF1 1 strand | PF1 1 strand | 60 | 0 |
| L | Braided element 1-L | CF1 | IF1 4 strands | IF1 4 strands | — | — |
| M | Covering fiber-like element 1-M | CF1 | IF1 1 strand | IF1 1 strand | — | — |
| N | Braided piezoelectric element 1-N | CF1 | PF1 4 strands | PF1 4 strands | 35 | 1 |
| O | Braided piezoelectric element 1-O | CF1 | PF2 4 strands | PF2 4 strands | 43 | 1 |
| P | Braided piezoelectric element 1-P | CF1 | PF1 8 strands | IF1 8 strands | 3.5 | 0 |
| Q | Covering fiber-like piezoelectric element 1-Q | CF1 | PF1 1 strand | IF1 1 strand | 80 | 0 |

| Ex. | Conductive fiber of sheath Z-twisting direction | Conductive fiber of sheath S-twisting direction | Tensile test | Twisting test | Bending test | Shear test | Compression test |
|---|---|---|---|---|---|---|---|
| A | None | None | −992 | 49 | 3 | −11 | 9 |
| B | CF2 4 strands | CF2 4 strands | −1262 | 58 | −1 | 13 | −18 |
| C | CF2 4 strands | CF2 4 strands | −1718 | −15 | −1 | 0 | 9 |
| D | CF2 4 strands | CF2 4 strands | −1060 | 45 | −8 | −1 | −2 |
| E | CF2 4 strands | CF2 4 strands | −1443 | −19 | −7 | 8 | 4 |
| F | CF2 4 strands | CF2 4 strands | −1115 | −16 | 8 | 3 | −3 |
| G | CF2 4 strands | CF2 4 strands | −872 | −10 | −3 | 2 | 0 |
| H | CF2 4 strands | CF2 4 strands | −355 | −4 | −11 | 0 | 13 |
| I | CF2 4 strands | CF2 4 strands | −3165 | −13 | −5 | −7 | 42 |
| J | CF2 4 strands | CF2 4 strands | 3347 | 24 | 10 | 1.2 | 41 |
| K | CF2 1 strand | CF2 1 strand | 650 | −41 | 19 | 4 | 21 |
| L | CF2 4 strands | CF2 4 strands | 12 | −9 | 5 | 7 | 45 |
| M | CF2 1 strand | CF2 1 strand | 11 | 0.9 | 1 | 1 | 5 |
| N | CF2 4 strands | CF2 4 strands | 85 | 80 | 3 | −5 | 5 |
| O | CF2 4 strands | CF2 4 strands | −33 | −10.0 | 5 | 10 | 50 |
| P | CF2 4 strands | CF2 4 strands | 29 | 183 | −6 | 1 | 8 |
| Q | CF2 4 strands | CF2 4 strands | −220 | −257 | 5 | −3 | −12 |

Based on the results in Table 2, when the orientation angle θ of the piezoelectric polymer with respect to the direction of the central axis is between 15° and 75° and the value of T1/T2 is between 0 and 0.8, a large signal is generated in response to tensile motion (elongation deformation) while a large signal is not generated with motion other than tensile motion, indicating that the covered fiber selectively responds to tensile motion. When Examples I and J are compared, for comparison between a case where most of the piezoelectric fibers are wrapped in the Z-twisting direction and where most of the piezoelectric fibers are wrapped in the S-twisting direction, the polarities of the signals in the tensile test were opposite, indicating that the direction of coiling corresponds to the polarity of the signal.

Also, while not shown in the table, comparing the signal under a tensile load and the signal without a tensile load with the covered fibers of Examples A to K showed that signals having approximately the same absolute values but with opposite polarities were generated, indicating that the covered fibers are suitable for quantitation of tensile load and displacement. On the other hand, comparing the signal under a tensile load and the signal without a tensile load using the covered fibers of Examples N and O showed that the polarities of the signals were sometimes opposite and sometimes the same, indicating that the covered fibers are not suitable for quantitation of tensile load and displacement. Furthermore, while not shown in the table, the noise level during the tensile test in Example B was lower than the noise level during the tensile test of Example A, indicating that noise can be reduced in a covered fiber shielded by situating conductive fibers on the outside of a braided covered fiber.

REFERENCE SIGNS LIST

A Piezoelectric fiber
A' Piezoelectric polymer
B Conductive fiber
1 Covered fiber
1' Braided covered fiber
2 Sheath
3 Core
10 Piezoelectric structure
11 Piezoelectric sensor
12 Amplification means
13 Output means
14 Transmission means
CL Fiber axis
α Coiling angle

The invention claimed is:

1. A piezoelectric structure comprising a braid composed of a conductive fiber and piezoelectric fibers, the braid being a covered fiber with the conductive fiber as the core and the piezoelectric fibers covering the periphery of the conductive fiber, wherein the covered fiber has at least one bent section, and when the piezoelectric structure is placed on a horizontal surface, the height from the horizontal surface to an uppermost section of the piezoelectric structure is greater than the diameter of the covered fiber.

2. The piezoelectric structure according to claim 1, wherein the height from the horizontal surface to the uppermost section of the piezoelectric structure is at least twice the diameter of the covered fiber.

3. The piezoelectric structure according to claim 1, wherein the covered fiber has one or more knots at any desired locations.

4. The piezoelectric structure according to claim 3, wherein the knots are selected from the group consisting of decorative knots, rope knots and combinations thereof.

5. The piezoelectric structure according to claim 4, wherein the knots are decorative knots, and the decorative knots are selected from the group consisting of half hitch knots, kissho knots, tsuyu knots, 15-angled star knots, myoga knots, chrysanthemum knots, and combinations thereof.

6. The piezoelectric structure according to claim 1, wherein the flexural rigidity of the conductive fiber is no greater than $0.05 \times 10^{-4}$ Nm$^2$/m.

7. The piezoelectric structure according to claim 1, wherein the conductive fiber is a metal coated organic fiber.

8. The piezoelectric structure according to claim 1, wherein the piezoelectric fibers include polylactic acid as the main component.

9. The piezoelectric structure according to claim 8, wherein the piezoelectric fibers include mainly poly-L-lactic acid or poly-D-lactic acid with an optical purity of 99% or greater.

10. The piezoelectric structure according to claim 1, wherein the piezoelectric fibers are uniaxially oriented and include crystals.

11. The piezoelectric structure according to claim 1, which detects the size of stress applied to the covered fiber and/or the location at which it is applied.

12. The piezoelectric structure according to claim 11, wherein the stress to be detected is frictional force between the surface of the covered fiber and the surface of a contacting object.

13. The piezoelectric structure according to claim 11, wherein the stress to be detected is resistance in the direction perpendicular to the surface or tip section of the covered fiber.

14. The piezoelectric structure according to claim 1, wherein the covered fiber outputs an electrical signal by elongation deformation.

15. The piezoelectric structure according to claim 1, wherein the covered fiber has a core formed of conductive fiber, and a sheath formed of braided piezoelectric fibers covering the core.

16. The piezoelectric structure according to claim 15, wherein the piezoelectric fibers are of a piezoelectric polymer including as the main component a crystalline polymer having an absolute value of between 0.1 pC/N and 1000 pC/N for the piezoelectric constant d14, when the orientation axis is the third axis, the orientation angle of the piezoelectric polymer with respect to the direction of the central axis of the core covered by the piezoelectric polymer is between 15° and 75°, and the piezoelectric polymer includes a P-body containing a crystalline polymer with a positive piezoelectric constant d14 value as a main component and an N-body containing a crystalline polymer with a negative value as a main component, wherein for a portion of the central axis having a length of 1 cm, the value of T1/T2 is between 0 and 0.8, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

17. The piezoelectric structure according to claim 1, wherein the insulating fibers further cover the periphery of the conductive fiber.

18. The piezoelectric structure according to claim 17, wherein the piezoelectric fibers are coiled around the periphery of the conductive fiber in the Z-twisting direction and the insulating fibers are coiled around the periphery of the conductive fiber in the S-twisting direction, or the piezoelectric fibers are coiled around the periphery of the conductive fiber in the S-twisting direction and the insulating fibers are coiled around the periphery of the conductive fiber in the Z-twisting direction.

19. The piezoelectric structure according to claim 1, further provided with a layer composed of conductive fiber on the outside of the covered fiber.

20. A piezoelectric sensor using the piezoelectric structure according to claim 1.

21. A device comprising:
a piezoelectric sensor according to claim 20,
amplification means that amplifies an electrical signal outputted from the piezoelectric sensor in response to applied pressure, and
output means that outputs the electrical signal amplified by the amplification means.

22. The device according to claim 21, further comprising transmission means that transmits the electrical signal outputted from the output means, to an external device.

23. A device comprising:
the piezoelectric sensor according to claim 20,
output means that outputs an electrical signal from the piezoelectric sensor in response to applied pressure, and
transmission means that transmits the electrical signal outputted from the output means, to an external device.

\* \* \* \* \*